United States Patent
Weiss et al.

(10) Patent No.: US 11,287,481 B2
(45) Date of Patent: *Mar. 29, 2022

(54) METHODS AND ALGORITHMS OF CYCLIC COULOMETRY

(71) Applicant: Xilectric, Inc., Fall River, MA (US)

(72) Inventors: Steven E. Weiss, Auburndale, MA (US); Charles R. Lemay, Portsmouth, NH (US); Andrew Ferencz, Southborough, MA (US)

(73) Assignee: Xilectric, Inc., Fall River, MA (US)

( * ) Notice: Subject to any disclaimer, the term of this patent is extended or adjusted under 35 U.S.C. 154(b) by 254 days.

This patent is subject to a terminal disclaimer.

(21) Appl. No.: 16/432,331

(22) Filed: Jun. 5, 2019

(65) Prior Publication Data

US 2020/0386822 A1 Dec. 10, 2020

(51) Int. Cl.
*G01R 31/3842* (2019.01)
*G01R 31/367* (2019.01)
(Continued)

(52) U.S. Cl.
CPC ....... *G01R 31/3842* (2019.01); *G01R 31/367* (2019.01); *G01R 31/388* (2019.01);
(Continued)

(58) Field of Classification Search
CPC .............. G01R 31/3842; G01R 31/388; G01R 31/367; H02J 7/0078; H02J 7/008; H02J 7/00; H01M 10/484; H01M 10/48
See application file for complete search history.

(56) References Cited

U.S. PATENT DOCUMENTS 5,952,815 A * 9/1999 Rouillard .............. H02J 7/0016
320/116
9,274,157 B2 3/2016 Bertness
(Continued)

OTHER PUBLICATIONS

Burns, John Christopher, "High Precision Coulometry as a Technique for Evaluating the Performance and Lifetime of Li-Ion Batteries", MS of Science Thesis at Dalhousie University, Halifax, Nova Scotia, CA, [Online] Retrieved from the internet: <https://dalspace.library.dal.ca/xmlui/bitstream/handle/10222/14115/Burns_John_MSc_PHYC_August_2011.pdf?sequence=1&isAllowed=y>, (Aug. 2011), 99 pgs.

*Primary Examiner* — Vuthe Siek
(74) *Attorney, Agent, or Firm* — Schwegman Lundberg & Woessner, P.A.

(57) ABSTRACT

Systems, devices, and methods of diagnosing an electrochemical cell using cyclic coulometry are discussed. An exemplary battery diagnostic system comprises a current generator to generate symmetric charge current and discharge current to excite an electrochemical cell, and a cyclic coulometer to evaluate performance of the electrochemical cell. The cyclic coulometer can adjust at least one of a charge time for applying the charge current, or a discharge time for applying the discharge current, to keep a monitored cell voltage toward a specific setpoint. The adjustment of charge or discharge time can be achieved by changing a current switch timing for reversing current from a first to a second current direction. The cyclic coulometer measures one or more electrical parameters during the charge or discharge cycle, and generates a performance metric using the measured electrical parameters.

22 Claims, 16 Drawing Sheets

(51) Int. Cl.
*G01R 31/388* (2019.01)
*H01M 10/48* (2006.01)
*H02J 7/00* (2006.01)

(52) U.S. Cl.
CPC ........... *H01M 10/484* (2013.01); *H02J 7/008* (2013.01); *H02J 7/0078* (2013.01)

(56) References Cited

U.S. PATENT DOCUMENTS

| | | |
|---|---|---|
| 9,373,972 B2 | 6/2016 | Ghantous et al. |
| 9,417,290 B1 | 8/2016 | Wang et al. |
| 10,705,152 B1 * | 7/2020 | Weiss ................. G01R 31/3828 |
| 2002/0070706 A1 | 6/2002 | Champlin |
| 2003/0206021 A1 | 11/2003 | Laletin et al. |
| 2008/0024137 A1 | 1/2008 | Carlin et al. |
| 2010/0076705 A1 | 3/2010 | Liu et al. |
| 2011/0295532 A1 | 12/2011 | Stukenberg |
| 2012/0041697 A1 | 2/2012 | Stukenberg |
| 2015/0276889 A1 | 10/2015 | Osaka et al. |
| 2020/0287257 A1 * | 9/2020 | Karushev .............. H01M 12/08 |

* cited by examiner

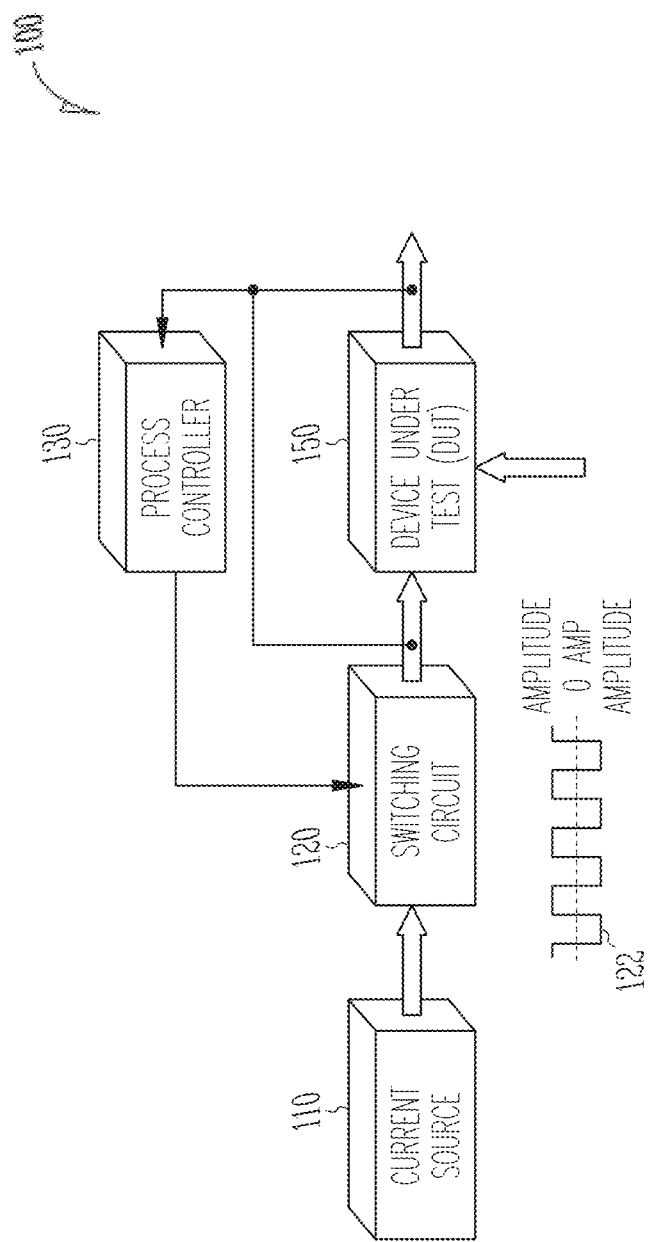

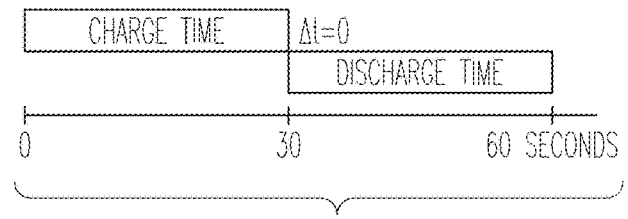
Fig. 4A
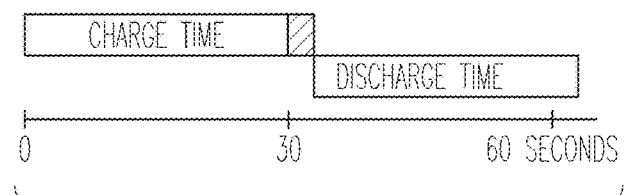
Fig. 4B
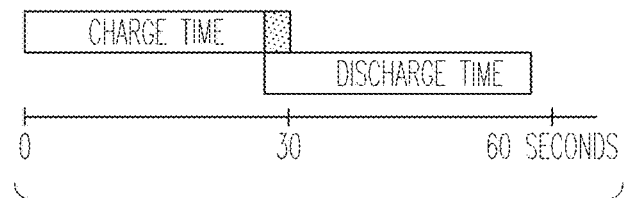
Fig. 4C
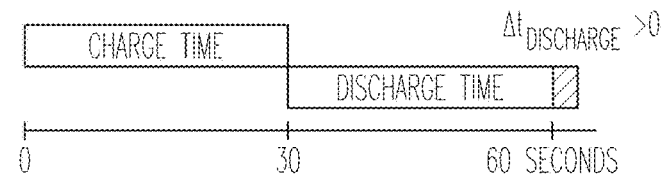
Fig. 4D
Fig. 4E

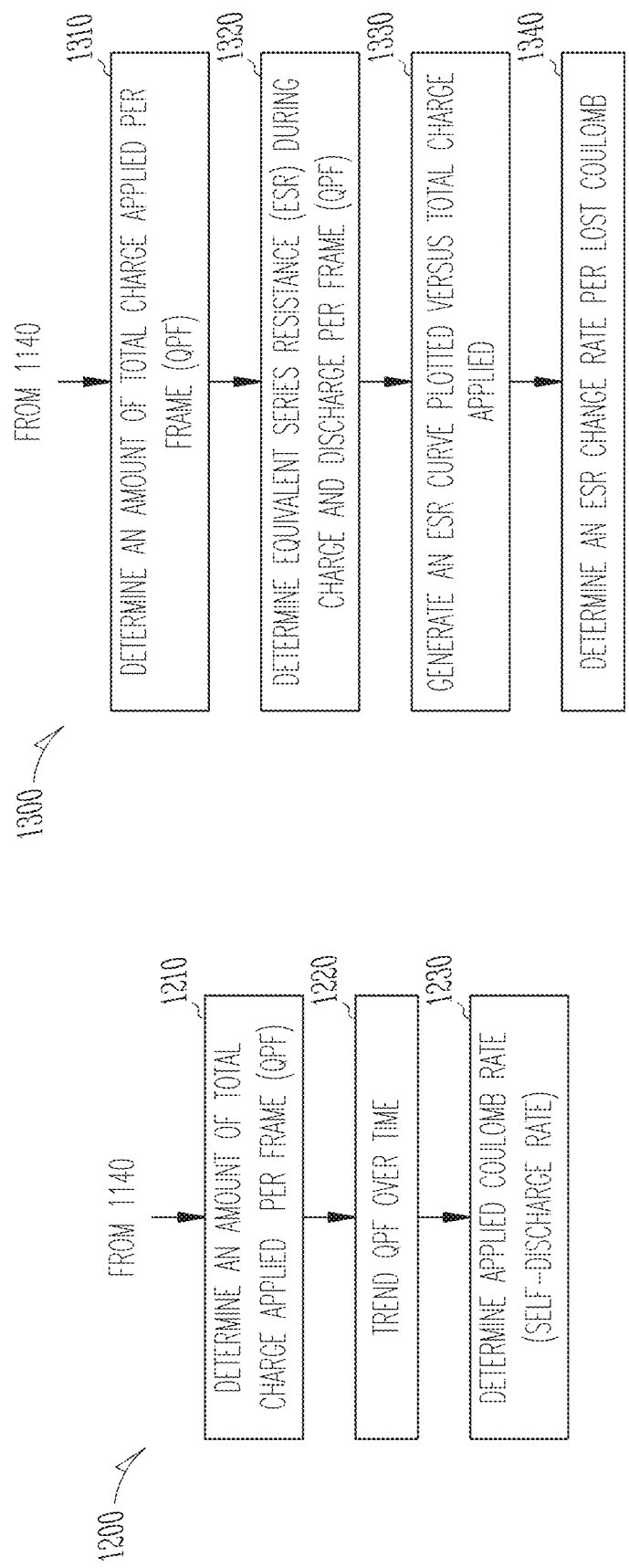

METHODS AND ALGORITHMS OF CYCLIC COULOMETRY

STATEMENT OF U.S. GOVERNMENT SUPPORT

This invention was made with the U.S. Government support under Contract No. DE-SC0018908 awarded by the Department of Energy. The Government has certain rights in this invention.

TECHNICAL FIELD

This document relates generally to electrochemical cells, and more particularly, to systems, apparatus, and methods for cycle testing of electrochemical cells using cyclic coulometry.

BACKGROUND

Coulometry is an electrochemical technique that measures the total coulombs of electricity consumed or produced during electrochemical reactions. Today, there are two basic categories of coulometric techniques. Controlled-potential coulometry applies a constant potential to the electrochemical cell using a potentiostat. Controlled-current coulometry applies a constant current to the electrochemical cell using a galvanostat. In both cases, the total charge, Q, passed through the electrochemical cells is calculated by integrating the current as a function of time. Coulometry has many applications in the field of electrochemistry. For example, coulometry can be used to characterize the performance of batteries, fuel cells, or other electrochemical reactions.

Lithium-ion (Li-ion) batteries are becoming a dominant battery chemistry. A Li-ion battery is a type of rechargeable battery in which lithium ions move from the negative electrode to the positive electrode during discharge and back when charging. Due primarily to their high energy density, Li-ion batteries have become the most common battery type in modern battery electric vehicles (BEVs). Unlike the starting, lighting, and ignition batteries, the Li-ion batteries in BEVs supply power over sustained periods of time, and are characterized by their relatively high power-to-weight ratio, specific energy and energy density. They also have low self-discharge rates.

Cycle life is a measure of the number of charge-discharge cycles that a battery can perform before its nominal capacity falls below a specific threshold (e.g., 80% of its initial rated capacity). Cycle life varies tremendously depending on cycling conditions, chemistry, cell design, and manufacturing quality. For example, depending on how a Li-ion battery is used in application, the Li-ion battery may present significant degradation lasting only hundreds of cycles or could be designed to last for many thousand cycles.

Technologies that improve abuse tolerance or cycle life of Li-ion batteries would have large commercial interest. However, proving new technologies or even iterating on existing formulations to improve cycle life is challenging given that Li-ion chemistries exist that can cycle for many years.

Cycle testing is an important battery qualification test. A common battery evaluation process entails cycling a test cell under a fixed current between a lower and upper voltage limit to study the performance of the batteries over the lifetime of the cycling. Cells are subjected to repeated charge-discharge cycles to verify that the cells meet the manufacturer's claimed cycle life. Various cell performance parameters such as temperature, capacity, impedance, power output and discharge time can be monitored and recorded during the test. The cycle testing verifies that the battery performance is in-line with the end product reliability and lifetime expectations.

High precision coulometers are capable of measuring the coulombic efficiency of a Li-ion battery to 50 ppm accuracy. The coulombic efficiency metric compares the coulombs required to charge a battery to the coulombs obtained from discharge. Additional battery-specific tests can also be conducted under stringent and a broad range of test conditions to assess risks associated with the battery under test. Knowledge of cell performance under various operating environments and usage patterns can be helpful to optimize battery design for various applications.

OVERVIEW

This document discusses, among other things, systems, devices, and methods of diagnosing an electrochemical cell such as a battery cell using techniques of cyclic coulometry. An exemplary battery diagnostic system comprises a current generator to generate symmetric charge current and discharge current to excite an electrochemical cell, and a cyclic coulometer to evaluate performance of the electrochemical cell. The cyclic coulometer includes a controller circuit to adjust at least one of a charge time for applying the charge current, or a discharge time for applying the discharge current, to maintain the cell voltage at a specific setpoint. The adjustment of charge or discharge time may be achieved by changing a current switch timing for reversing current from a first to a second current direction. A measurement circuit measures one or more electrical parameters during the charge or discharge cycle, and generates a battery metric using the measured electrical parameters.

Example 1 is a system for testing an electrochemical cell, comprising: a current generator configured to generate symmetric charge current and discharge current in a cycling period to respectively charge and discharge the electrochemical cell; a cyclic coulometer including: a controller circuit, coupled to the current generator, configured to: adjust at least one of a charge time or a discharge time for controlling a monitored cell voltage of the electrochemical cell toward a specific setpoint; and control the current generator to electrically cycle the electrochemical cell using the charge current and the discharge current according to at least one of the adjusted charge time or the adjusted discharge time; and a measurement circuit configured to measure one or more electrical parameters, and to generate a performance metric of the electrochemical cell using the measured one or more electrical parameters.

In Example 2, the subject matter of Example 1 optionally includes the current generator that can be configured to generate a square wave current using a unipolar direct-current source.

In Example 3, the subject matter of any one or more of Examples 1-2 optionally includes the controller circuit that can be configured to adjust the charge time or the discharge time by changing a current switch timing for reversing from the charge current to the discharge current, the charge current and the discharge current having opposite current directions.

In Example 4, the subject matter of Example 3 optionally includes a current switch circuit including switches that can be configured to, in response to a control signal from the controller circuit: close only first one or more of the switches to generate the charge current to charge the electrochemical cell; and close only second one or more of the switches, according to the current switch timing, to generate the discharge current to discharge the electrochemical cell.

In Example 5, the subject matter of Example 4 optionally includes one or more of the switches that can be FET transistors.

In Example 6, the subject matter of any one or more of Examples 3-5 optionally includes the measured one or more electrical parameters that can include a voltage or current response of the electrochemical cell, and the control circuit is configured to determine or update the current switch timing using the monitored voltage or current response.

In Example 7, the subject matter of Example 6 optionally includes the controller circuit that can include a Proportional-Integral (PI) controller or a Proportional-Integral-Derivative (PID) controller.

In Example 8, the subject matter of any one or more of Examples 6-7 optionally includes the monitored voltage or current response that can include one or more of: an average or a peak cell voltage over an entire frame comprising the adjusted charge time and the adjusted discharge time; an average or a peak cell voltage over the adjusted charge time; an average or a peak cell voltage over the adjusted discharge time; an average or a peak cell current over an entire frame; an average or a peak cell current over the adjusted charge time; or an average or a peak cell current over the adjusted discharge time.

In Example 9, the subject matter of any one or more of Examples 6-8 optionally includes the controller circuit that can be configured to: determine the current switch timing including a determination of an excess charge time or an excess discharge time using the monitored voltage or current response; and increase or decrease the charge time by the determined excess charge time, or increase or decrease a base discharge time by the determined excess discharge time.

In Example 10, the subject matter of Example 9 optionally includes the excess charge time or the excess discharge time that can be represented by a count of ticks each having a duration of a specified switching timer resolution.

In Example 11, the subject matter of any one or more of Examples 6-10 optionally includes the controller circuit that can be configured to determine the current switch timing further using one or more of: ambient temperature information of an electrochemical cell test environment; or state of charge or state of health of the electrochemical cell.

In Example 12, the subject matter of any one or more of Examples 1-11 optionally includes the measurement circuit that can include a performance metric generator configured to: determine an amount of total charge applied during at least a portion of a cycling period; and determine a self-discharge rate using the determined amount of total charge applied, the self-discharge rate representing an applied current needed to keep the cell voltage of the electrochemical cell at the specific setpoint.

In Example 13, the subject matter of Example 12 optionally includes the cyclic coulometer that can include a coulomb counter configured to measure the amount of total charge applied during the specified portion of the cycling period.

In Example 14, the subject matter of any one or more of Examples 12-13 optionally include the cyclic coulometer that can be configured to determine the amount of total charge applied including an amount of total charge applied per frame (QPF).

In Example 15, the subject matter of Example 14 optionally includes the cyclic coulometer that can be configured to determine the QPF by integrating an applied current over time within a frame.

In Example 16, the subject matter of any one or more of Examples 14-15 optionally includes the performance metric generator that can be configured to generate a trend of QPF over time, and to determine the self-discharge rate using a slope of the generated trend of QPF.

In Example 17, the subject matter of any one or more of Examples 14-16 optionally includes the cyclic coulometer that can be configured to: determine a first amount of total charge applied during only a charge period, and a second amount of total charge applied during only a discharge period subsequent to the charge period, and determine the QPF using a difference between the first amount of total charge applied and the second amount of total charge applied.

In Example 18, the subject matter of Example 17 optionally includes the cyclic coulometer that can be configured to determine the first amount of total charge applied using a first total tick count during only the charge period, and to determine the second amount of total charge applied using a second total tick count during only the discharge period.

In Example 19, the subject matter of any one or more of Examples 12-18 optionally includes the measured one or more electrical parameters, which can include a cell voltage of the electrochemical cell, and wherein the performance metric generator is configured to determine an equivalent series resistance (ESR) of the electrochemical cell using (1) at least one of a charge voltage during a charge period or a discharge voltage during a discharge period, and (2) the applied current.

In Example 20, the subject matter of Example 19 optionally includes the performance metric generator that can be configured to generate an ESR curve as a function of the amount of total charge applied, and to determine an ESR change rate per lost coulomb using a slope of the ESR curve at a specific amount of total charge applied.

In Example 21, the subject matter of Example 20 optionally includes the performance metric generator that can be configured to: determine multiple ESR change rates under different test conditions, each of the different test conditions represented by a parameter set including one or more of a C-rate value, a temperature measurement, or a cell voltage setpoint; and generate a representation of the multiple ESR change rates over the parameter set.

In Example 22, the subject matter of any one or more of Examples 19-21 optionally includes the performance metric generator that can be configured to determine the ESR of the electrochemical cell using at least one of a difference between the charge voltage and an average cell voltage, or a difference between the discharge voltage and the average cell voltage.

In Example 23, the subject matter of Example 22 optionally includes the performance metric generator that can be configured to determine the average cell voltage using an average or a weighted average of the charge voltage and the discharge voltage.

In Example 24, the subject matter of any one or more of Examples 12-23 optionally includes the performance metric generator that can be configured to: determine multiple self-discharge rates under different test conditions, each of the different test conditions represented by a parameter set including one or more of a C-rate value, a temperature measurement, or a cell voltage setpoint; and generate a representation of the multiple self-discharge rates over the parameter set.

In Example 25, the subject matter of Example 24 optionally includes the representation of the multiple self-discharge rates that can include a two- or multi-dimensional array, or a two- or multi-dimensional graph.

In Example 26, the subject matter of any one or more of Examples 1-25 optionally includes an output device communicatively coupled to the cyclic coulometer, the output device configured to display the measured one or more electrical parameters or the generated performance metric of the electrochemical cell.

In Example 27, the subject matter of Example 26 optionally includes the output device that can be configured to display one or more of multiple self-discharge rates over a plurality of test conditions, or multiple ESR change rates over a plurality of test conditions.

In Example 28, the subject matter of Example 27 optionally includes the output device that can be configured to display a three-dimensional (3D) loss rate map representing the multiple self-discharge rates over a plurality of test conditions each represented by two parameters selected from the parameter set.

In Example 29, the subject matter of any one or more of Examples 27-28 optionally includes the output device that can be configured to display a three-dimensional (3D) ESR rate map representing the multiple ESR change rates over a plurality of test conditions each represented by two parameters selected from the parameter set.

Example 30 is a method for testing an electrochemical cell. The method comprises steps of: electrically cycling the electrochemical cell, via a current generator, by applying a charge current for a charge time and a discharge current for a discharge time in a cycling period, the charge current and the discharge current being symmetric and having opposite directions; measuring, via a measurement circuit, one or more electrical parameters during the electrical cycling of the electrochemical cell; adjusting, via a controller circuit, the charge time or the discharge time for controlling a monitored cell voltage of the electrochemical cell toward a specific setpoint: and generate, via a measurement circuit, a performance metric of the electrochemical cell using the measured one or more electrical parameters.

In Example 31, the subject matter of Example 30 optionally includes adjusting the charge time or the discharge time that can include updating a current switch timing for reversing from the charge current to the discharge current.

In Example 32, the subject matter of Example 31 optionally includes the measured one or more electrical parameters that can include a voltage or current response of the electrochemical cell, and wherein updating the current switch timing is by using the monitored voltage or current response.

In Example 33, the subject matter of any one or more of Examples 31-32 optionally includes adjusting the charge time or discharge time that can include increasing or decreasing the charge time by an excess charge time, the excess charge time represented by a count of ticks each having a duration of specified switching timer resolution.

In Example 34, the subject matter of any one or more of Examples 31-33 optionally includes adjusting the charge time or discharge time that can include increasing or decreasing the discharge time by an excess discharge time, the excess discharge time represented by a count of ticks each having a duration of a specified switching timer resolution.

In Example 35, the subject matter of any one or more of Examples 30-34 optionally includes generating the performance metric that can include steps of: determining an amount of total charge applied during a specified portion of the cycling period; and determining a self-discharge rate using the determined amount of total charge applied, the self-discharge rate representing an applied current needed to keep the cell voltage of the electrochemical cell at the specific setpoint.

In Example 36, the subject matter of Example 35 optionally includes the amount of total charge applied that can include a total charge applied per frame (QPF) corresponding to time of the frame, and wherein determining the self-discharge rate includes using a slope of a trend of QPF over time.

In Example 37, the subject matter of Example 36 optionally includes determining the QPF includes integrating the applied current over time within a frame.

In Example 38, the subject matter of any one or more of Examples 36-37 optionally includes determining the QPF that can include steps of: determining a first amount of total charge applied during only a charge period, and a second amount of total charge applied during only a discharge period subsequent to the charge period; and determining the QPF using a difference between the first amount of total charge applied and the second amount of total charge applied.

In Example 39, the subject matter of Example 38 optionally includes the first amount of total charge applied that can be determined by using a first total tick count during only the charge period, and the second amount of total charge applied that can be determined by using a second total tick count during only the discharge period.

In Example 40, the subject matter of any one or more of Examples 35-39 optionally includes the measured one or more electrical parameters that can include a cell voltage of the electrochemical cell, and wherein generating the performance metric can include determining an equivalent series resistance (ESR) of the electrochemical cell using (1) at least one of a charge voltage during a charge period or a discharge voltage during a discharge period, and (2) the applied current.

In Example 41, the subject matter of Example 40 optionally includes generating the performance metric that can include steps of: generating an ESR curve as a function of the amount of total charge applied; and determining an ESR change rate per lost coulomb using a slope of the ESR curve at a specific amount of total charge applied.

In Example 42, the subject matter of Example 41 optionally includes steps of: determining multiple ESR change rates under different test conditions, each of the different test conditions represented by a parameter set including one or more of a C-rate value, a temperature measurement, or a cell voltage setpoint; and generating a representation of the multiple ESR change rates over the parameter set, the representation including a two- or multi-dimensional array, or a two- or multi-dimensional graph.

In Example 43, the subject matter of any one or more of Examples 35-42 optionally includes generating the performance metric that can include: determining multiple self-discharge rates under different test conditions each represented by a parameter set including one or more of a C-rate value, a temperature measurement, or a cell voltage setpoint; and generating a representation of the multiple self-discharge rates over the parameter set, the representation including a two- or multi-dimensional array, or a two- or multi-dimensional graph.

In Example 44, the subject matter of Example 43 optionally includes displaying on a user interface one or more of the measured one or more electrical parameters or the measured performance metric.

Example 45 is at least one machine-readable medium including instructions that, when executed by a machine, cause the machine to: electrically cycle the electrochemical cell by applying a charge current for a charge time and a discharge current for a discharge time in a cycling period, the charge current and the discharge current being symmetric and having opposite directions; measure one or more electrical parameters during the electrical cycling of the electrochemical cell; adjust the charge time or the discharge time for controlling a monitored cell voltage of the electrochemical cell toward a specific setpoint; and generate a performance metric of the electrochemical cell using the measured one or more electrical parameters.

In Example 46, the subject matter of Example 45 optionally includes instructions that, when performed by the machine, cause the machine to: measure one or more electrical parameters including a voltage or current response of the electrochemical cell; and update a current switch timing for reversing from the charge current to the discharge current using the monitored voltage or current response.

In Example 47, the subject matter of any one or more of Examples 45-46 optionally includes instructions that, when performed by the machine, cause the machine to: determine an amount of total charge applied during a specified portion of the cycling period; and determine a self-discharge rate using the determined amount of total charge applied, the self-discharge rate representing an applied current needed to keep the cell voltage of the electrochemical cell at the specific setpoint.

In Example 48, the subject matter of Example 47 optionally includes the amount of total charge applied that can include a total charge applied per frame (QPF) corresponding to time of the frame, and the instructions that, when performed by the machine, cause the machine to: generate a trend of QPF over time; and determine the self-discharge rate using a slope of the generated trend of QPF.

In Example 49, the subject matter of any one or more of Examples 47-48 optionally includes the measured one or more electrical parameters that can include a cell voltage of the electrochemical cell, and the instructions that, when performed by the machine, cause the machine to: determine an equivalent series resistance (ESR) of the electrochemical cell using (1) at least one of a charge voltage during a charge period or a discharge voltage during a discharge period, and (2) the applied current; generate an ESR curve as a function of the amount of total charge applied; and determine an ESR change rate per lost coulomb using a slope of the ESR curve at a specific amount of total charge applied.

In Example 50, the subject matter of Example 49 optionally includes instructions that, when performed by the machine, cause the machine to: determine multiple ESR change rates under different test conditions, each of the different test conditions represented by a parameter set including one or more of a C-rate value, a temperature measurement, or a cell voltage setpoint; and generate a representation of the multiple ESR change rates over the parameter set, the representation including a two- or multi-dimensional array, or a two- or multi-dimensional graph.

In Example 51, the subject matter of any one or more of Examples 47-50 optionally include instructions that, when performed by the machine, cause the machine to: determine multiple self-discharge rates under different test conditions each represented by a parameter set including one or more of a C-rate value, a temperature measurement, or a cell voltage setpoint; and generate a representation of the multiple self-discharge rates over the parameter set, the representation including a two- or multi-dimensional array, or a two- or multi-dimensional graph.

Example 52 is at least one machine-readable medium including instructions that, when executed by a machine, cause the machine to perform the methods as discussed in any one or more of Examples 30-44.

Example 53 is a system for testing an electrochemical cell. The system comprises means for performing the methods as discussed in any one or more of Examples 30-44.

The cyclic coulometry techniques discussed in this document help improve determination of the relative performance effects of the variables utilized to produce, manufacture, or store electrochemical cells and batteries in an accelerated manner. The cyclic coulometry can help optimize cell chemistry, manufacturing methods, materials selection, or other variable of interest. In accordance with some embodiments, the cyclic coulometry techniques discussed herein may be used to determine the quality of an electrochemical cell available for purchase. The cyclic coulometry may also be used to non-destructively characterize the quality of cells prior to including in a product for sale in an expedient manner.

This overview is an overview of some of the teachings of the present application and not intended to be an exclusive or exhaustive treatment of the present subject matter. Further details about the present subject matter are found in the detailed description and appended claims. Other aspects of the disclosure will be apparent to persons skilled in the art upon reading and understanding the following detailed description and viewing the drawings that form a part thereof, each of which are not to be taken in a limiting sense. The scope of the present disclosure is defined by the appended claims and their legal equivalents.

BRIEF DESCRIPTION OF THE DRAWINGS

Various embodiments are illustrated by way of example in the figures of the accompanying drawings. Such embodiments are demonstrative and not intended to be exhaustive or exclusive embodiments of the present subject matter.

FIG. 1 is a block diagram illustrating an example of a cyclic coulometer system and portions of an environment in which the system may operate

FIGS. 4A-4E are timing diagrams illustrating examples of adjusting charge time or discharge time using an excess time in the charge or discharge step.

FIGS. 12 and 13 are flow charts illustrating respective methods of generating various battery metrics using the electrical measurements taken during a cycle test.

DETAILED DESCRIPTION

Figure 2A:
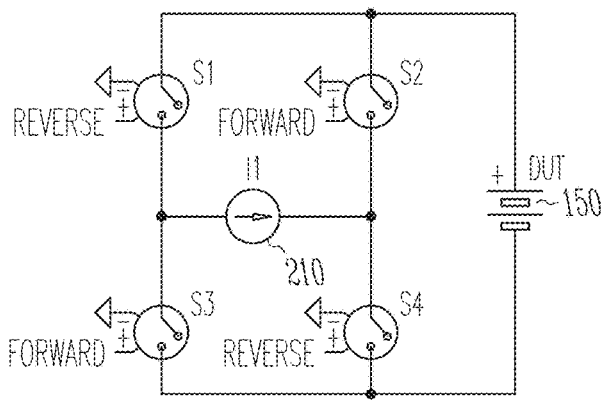
FIGS. 2A-2C are schematics illustrating an example of at least a portion of a current switching circuit configured to provide a precisely timed polarity change at a specific current switch timing to produce charge and discharge current.

A battery cycler is an apparatus or a tool for charging and discharging a battery under a controlled condition, and evaluating battery performance based on various battery metrics such as slippage rates, coulombic efficiency, energy capacity, rate capability, or capacity retention, among others. Traditionally, battery cycling is conducted between fixed voltage limits. During charge, a current is applied until the battery reaches a preset charge voltage limit (a charge setpoint). The battery is then discharged until it reaches a discharge voltage limit (a discharge setpoint). The charge-discharge cycle then continues. Charge and discharge rates are typically governed by a fixed C-rate. For example, for a fully charged battery rated at one ampere-hour (Ah), it provides 1 A discharge current for one hour at 1C rate, 500 mA for two hours at 0.5C rate, or 2 A current for 0.5 hour at 2C rate. Cell inefficiencies accumulate during cell cycling resulting in capacity loss (lost coulombs). As the cell ages, the internal resistance of the cell increases over time.

Coulometry is an electrochemical technique that measures the amount of electricity in coulombs consumed or produced during electrochemical reactions. Conventionally, two coulometric techniques are used. Potentiostat coulometry (also known as controlled-potential coulometry) applies a constant potential to a battery under test using a potentiostat, an electronic device to control a three-electrode cell and run electroanalytical experiments. Galvanostat or amperostatic coulometry (also known controlled-current coulometry) applies a constant current to the battery using a galvanostat, a device to keep the current through an electrolytic cell in coulometric titrations constant, disregarding changes in the load itself. In both cases, the amount of total charge applied (Q) passing through the electrochemical cells may be calculated by integrating the current as a function of time.

Coulombic efficiency (CE) describes the efficiency of a battery system. CE is the ratio of the amount of total charge extracted from the battery ($Q_{discharge}$) to the amount of total charge applied into the battery ($Q_{charge}$) over a full cycle. CE is a strong function of C-rate. At low C-rates, more time is available for parasitic losses to occur, resulting in a lower measured CE metric. The slower C-rates help to spread the data to help differentiate the cells, but the slower C-rates may not actually represent use conditions experienced in most applications.

High precision coulometry (HPC) is a technique to characterize CE, and can detect with improved accuracy differences in cell performance between cells of different chemistry that are made to last thousands of cycles. Compared to traditional precision cyclers, an HPC system uses faster data processing, more accurate current sources, and more stable voltage measurements.

Although HPC has been regarded as an accepted standard for evaluating battery chemistries, it has some limitations. For example, HPC is often used to measure CE of a Li-ion battery under a slow charge-discharge cycle. The design of an HPC system can be complicated at least due to the long-time scales involved in the charge and discharge cycles. In particular, the current source needs to be very stable such that the applied current remains constant over a long time (e.g., 20 hours) required for a full cycle. Stable and highly accurate current sources are expensive and contribute to the overall cost of the system. Newer systems even maintain the electronics in temperature-controlled environments to prevent drift in the power electronics. In some cases, the HPC is able to measure the coulombic efficiency to 50 parts per million (ppm) accuracy.

The basic premise of HPC is that batteries that are more efficient will last longer. However, data has shown that using CE alone to predict cycle life may be insufficient. To overcome this limitation, it has been suggested that post-cycled charge-transfer resistance be used along with CE to predict cycle life. However, this presents a challenge, as the traditional measurements of internal resistance (IR) generally cannot be implemented during HPC requiring post characterization. The cumulative coulombs lost among different test cells from the HPC test protocol are not the same. Typically, the post-charge transfer resistance is a single data point measured at some poorly defined state. Because HPC is incapable of measuring the growth in the post-charge transfer resistance as a function of lost coulombs, it does not adequately differentiate various loss mechanisms that may be present.

Energy storage solutions are defined by the application requirements. Grid level storage relating to voltage stability or regulation control require short cycles that operate with high frequency. Automotive applications as well as renewable integration require energy storage with large capacity and greater depth of discharge. Optimizing pack design for various applications requires both technical and economic models of cell performance and lifetime. However, since cycle life varies tremendously depending on cycling conditions, an optimal design for one condition may not be ideal for another. Using tools that exist today, it is difficult to prove the effect of various operating conditions on electrochemical storage durability using simple battery cyclers. Additionally, the current approaches are slow and provide convoluted data with respect to durability.

For at the least foregoing, the present inventors have recognized an unmet need of improved coulometry for battery evaluation. Disclosed herein are systems, devices, and methods of cyclic coulometry. According to some embodiments, a cyclic coulometer may introduce small DC pulses, automatically compensate over time for voltage drop attributable to cumulative coulomb loss, and thereby maintain a monitored cell potential at a setpoint. In some examples, the cyclic coulometer determines applied coulomb rates needed to maintain the test cell at a specified setpoint voltage under different cell conditions, thus effectively parameterizes the loss rate at specific conditions (e.g., temperature, setpoint voltage, or applied C-rate). A loss rate curve or a loss rate map may be generated and presented to a user using the parametrized loss rates.

The cyclic coulometry discussed herein may be implemented in a battery diagnostic system. According to some embodiments, a battery diagnostic system comprises a current generator to generate symmetric charge current and discharge current to excite an electrochemical cell, and a cyclic coulometer to evaluate performance of the electrochemical cell. The cyclic coulometer includes a controller circuit to adjust at least one of a charge time for applying the charge current, or a discharge time for applying the discharge current, to maintain a monitored cell voltage towards a specific setpoint. The adjustment of charge or discharge time may be achieved by changing a current switch timing for reversing current from a first to a second current direction. A measurement circuit measures one or more electrical parameters during the charge or discharge cycle, and generates a battery metric using the measured electrical parameters.

The cyclic coulometry discussed herein improves battery cycling and provides complete information on battery performance and diagnostics. For example, the cyclic coulometry allows one to measure capacity loss at a given C-rate or temperature for any state of charge. In an example, researchers can probe the fade rate at different preset cell voltage independently. High voltage stability could be studied while avoiding losses associated with full depth of discharge cycling.

The cyclic coulometry provides concurrent measurements of CE and internal resistance (IR). The average voltage of the full duty cycle is controlled to the setpoint, but the voltages response of each half cycle may be used to calculate an IR measurement. The IR increases overtime as the coulombic inefficiencies accumulate. Conventional HPC cannot perform IR measurements during HPC testing. Instead, one must measure the growth in IR after completion of the HPC test (thus the IR so measured is also known as post-cycled charge-transfer resistance). However, the post-charge transfer resistance is a single data point measured at some poorly defined state. For example, the cumulative coulombs lost among different test cells after the HPC test is not the same. In contrast, the cyclic coulometry discussed in this document advantageously measures both CE and growth in IR concurrently. The growth in the charge transfer resistance may thus be presented as a function of lost coulombs. Given that both IR and CE are needed to predict cycle life, the cyclic coulometry discussed herein provides a more complete picture of cycle life, and presents a significant advancement beyond information obtained from using the current state of the art HPC.

Another advantage of the cyclic coulometry discussed in this document is that it measures and presents (e.g., graphically in a 3D plots) differential loss rate of batteries to load conditions directly. For example, by iterating the applied C-rates from low to high levels, the cyclic coulometry may provide insights into both battery storage (corresponding to zero C-rate) and cycling losses as a function of C-rate in the same test automatically. The cyclic coulometer system may be implemented and deployed to prove out new Li-ion formulations and to characterize the durability of commercial cells in application.

The battery metrology discussed in this document provides a direct measurement of loss rate at various cell conditions (temperature, setpoint voltage, applied C-rates, etc.). This allows battery manufacturers, storage designers, and materials providers to iterate faster while gaining superior insights. For example, cell manufacturers can quickly measure the effect of manufacturing processes and design on cell fidelity. Likewise, materials developers can measure the effect of their electrolyte additive or electrode formulation on cell stability at various operating conditions. Finally, end-users of energy storage can use the cyclic coulometry to discriminate various commercial offerings targeting those that perform best for their load requirements and to develop improved battery management algorithms. Compared to conventional HPC technology, the cyclic coulometry discussed herein better characterizes a battery's performance at various cell conditions (e.g., C-rates, states of charge, among others), enables precise techno-economic assessment of batteries under development, and improves battery design and development. The engineering data generated by the cyclic coulometry and data formulation (e.g., in a form of loss rate curve or loss rate map as to be discussed in the following) may be used to create improved battery management protocols and techno-economic models for energy storage deployments that require long life.

FIG. 1 is a block diagram illustrating an example of a cyclic coulometer system 100 and portions of an environment in which the system 100 may operate. The system 100 may be used to measure total applied coulombs during a charge-discharge cycle operation on a device under test (DUT) 150, obtain information about internal state of the DUT 150, and evaluate its performance. The system 100 includes a current source 110, a switching circuit 120, and a process controller 130. In contrast to conventional coulometry that applies a set current or a set voltage, the cyclic coulometer system 100 may adjust charge time for applying charge current, or discharge time for applying discharge current, to the DUT 150 to achieve various battery test objectives. According to some embodiments, the adjustment of at least one of the charge time or discharge time may be achieved by changing current switch timing between the charge step and the discharge step in a cycling period with a high time resolution. In one example, the cyclic coulometer system 100 may measure the applied coulomb rate needed to maintain a process variable at a desired state. In another example, the cyclic coulometer 100 may measure a loss rate of batteries as received from a manufacturer to determine cell quality. In various examples, the cyclic coulometer system 100 may perform diagnostic testing under different cell conditions, such as a range of temperature, states of charge, or states of health, among other conditions of interest.

The DUT 150 can be any electrochemical cell, such as batteries, fuel cells, flow cells, or other electrochemical cells. Coulometry testing of the DUT 150 may be performed using traditional 2-wire, 3-wire, or 4-wire connections. In order to minimize noise to measure a small applied current, it is desirable to minimize disturbances to the DUT 150 that contribute to noise in the measured variables. In an example, the DUT 150 may be situated in a tightly controlled thermal environment during the cycle test. Prior to the test, the DUT 150 may be stabilized at a set state of charge (representing the amount of energy left, compared to the energy when it is full), or aged to achieve various state of health conditions (representing an ability to deliver a specified performance compared to a fresh battery).

The current source 110 may be a benchtop or a precision power supply capable of outputting quiet current with little noise, and configured to provide current for charging and discharging the DUT 150 during a full cycling period. The current source 110 may operate in a potentiostat mode or a galvanostat mode. The output current may have a predetermined waveform with specific parameter values (e.g., amplitude, cycle period, frequency, duty cycle, etc.). In an example, the current source 110 may be a sinusoidal source. In another example, the current source 110 may be a square wave source.

In some examples, the current source 110 may be a direct-current (DC) source configured to provide unidirectional current with a specific amplitude. The current amplitude may be programmable. The cyclic coulometer system 100 may measure the output current (e.g., charge current or discharge current) continuously. In an example, the current source 110 may output stable current in a galvanostat mode, and works substantially identically during the charge and discharge steps. In an example, the current source 110 is a single unipolar current source that includes references, amplifiers, sense resistors, and feedback circuitry, and may be configured to exhibit single digit PPM level stability for the duration of the test.

The switching circuit 120, coupled to the current source 110, may controllably (e.g., via the process controller 130) alternate the direction of DC current output current to generate a square wave 122. A switching timer, having a specific time resolution T, may time the alternation of current direction. The switching timer may be part of the switching circuit 120, or otherwise coupled to the switching circuit 120. The resulting square wave has positive and negative phases each having a duration of multiples of T. The switching timer resolution T may be determined based on a frequency ($f_{clock}$) of a peripheral clock, $T=1/f_{clock}$ seconds. For example, for a clock frequency of 5 MHz, the switching timer resolution is 200 nanoseconds (nsec). In an example, T is less than 500 nsec. In another example, T is less than one microseconds (msec). In yet another example, T is approximately 5-10 msec. The switched current may be applied to the DUT 150 during the cycling process.

In the case that the current source 110 is a constant unipolar current source and the process controller 130 controls the switching circuit 120 to generate a square wave current 122, the process controller 130 may additionally control the switching circuit 120 to adjust at least one of the charge time or the discharge time to keep an output variable, such as an average cell voltage, at a preset setting. A cycling period comprises charge time $t_{charge}$ and discharge time $t_{discharge}$, both of which may be predetermined or programmable. The cycling period may be chosen to be large enough to have actual charge transfer occur in the electrochemical cell under test, while at the same time to be short enough such that the cell voltage response to the charge and discharge steps does not deviate from the cell setpoint to a large extent, so that the measured property may be attributed to the desired cell state. In an example, the cycling period is less than 10 minutes. In another example, the cycling period is approximately 5 minutes. In yet another example, the cycling period is approximately 60 seconds. The cycling period may alternatively be determined based on applied current desired and corresponding perturbation to the cell caused by the cycle. In an example, the charge time $t_{charge}$ is substantially equal to the discharge time $t_{discharge}$, resulting in symmetric charge and discharge steps.

The process controller 130 controls the switching circuit to adjust at least one of charge time or discharge time for controlling an output variable, such as an average cell voltage, toward a preset setting. In an example, the adjustment of charge or discharge time may be achieved by changing the timing of switching from the charge step to the discharge step during a charge-discharge cycle. Compared to traditional cyclers that control voltage (potentiostatic) or current (galvanostatic), adjusting the charge or discharge time or the current switch timing as discussed herein provides more precise yet stable control of charge-discharge steps with desirable resolution. In various examples, the switching circuit 120 can controllably switch the current direction using one or more voltage-controlled switches such as transistors, examples of which are discussed below with reference to FIGS. 2A-2C. Alternatively, the current source 110 may be a bidirectional source controllably outputting the current in either a first direction to charge the DUT 150, or a second direction opposite to the first direction to discharge the DUT 150.

In various examples, the process controller 130 may monitor a voltage or current response of the DUT 150 during the cycling period, and determine or update the current switch timing using the monitored voltage or current response. The process controller 130 may include a Proportional-Integral (PI) controller or a Proportional-Integral-Derivative (PID) controller configured to determine or update the current switch timing so as to keep a specific electrical parameter (e.g., an average cell voltage) at the specific setpoint. Examples of the voltage or current response being monitored and used for controlling the current switch timing may include average or peak cell voltage over the cycling period, average or peak charge voltage, average or peak discharge voltage, end of cycle voltage, average or peak current over the cycling period, average or peak charge current, or average or peak discharge current of the DUT 150. In an example, the process controller 130 may determine or update the current switch timing using information about ambient temperature of the environment in which the cycle test is conducted. A physics-based or empirically derived model may be used for model predictive control. The control model can use many input variables for optimization of the current switch timing. In some examples, information of state of charge, state of health, disturbances, or other cell conditions of interest may be used to determine or update the current switch timing. The state of charge is a short-term battery capability measure, which represents the amount of energy left, compared to the energy when it is full. State of health is a long-term capability measure, representing an ability to deliver a specified performance compared to a fresh battery.

In some examples, the timing control of charge/discharge steps may include an excess time $\Delta t$ applied to the charge or discharge step. The process controller 130 may use a PI or PID controller to maintain an output variable (e.g., current or voltage) at the desired setpoint by changing the excess time $\Delta t$ used. The excess time $\Delta t$ may be a positive or a negative value. For example, positive excess charge time increases the charge time to $t_{charge}+\Delta t$, and negative excess charge time decreases the charge time to $t_{charge}-\Delta t$. Likewise, positive excess discharge time increases the discharge time to $t_{discharge}+\Delta t$, and negative excess discharge time decreases the discharge time to $t_{discharge}-\Delta t$. Alternatively, the process controller 130 may adjust both the charge time and the discharge time, and maintain the full cycling period to be a constant (e.g., longer charge time of $t_{charge}+\Delta t$, followed by shorter discharge time $t_{discharge}-\Delta t$).

With the excess time $\Delta t$, the ratio of charge time to discharge time is altered. The total time of the cycling period plus the excess charge time $\Delta t$ is referred to as a frame. During the cycle test, the time-adjusted charge-discharge cycles are repeated frame after frame. In an example, the process controller 130 may update the excess charge time $\Delta t$ on a frame-by-frame basis, examples of which are discussed below with reference to FIGS. 4B-4E.

The excess time $\Delta t$ may be provided by the switching timer. In an example, the excess time $\Delta t$ may be multiples of the switching timer resolution T, $\Delta t=k*T$. The smallest excess time is equal to T. Such a current switching technique provided by the switching circuit 120 allows for stable, ultrafine tuning of charge-discharge cycle (in ticks, or increments of T). For example, for a 60-second cycling period consisting of 30-second base charge time and 30-second base discharge time, and a switching timer with a time resolution of T=200 nsec, the smallest excess charge time is $t_{charge}$=30.0000002 seconds. If the discharge time stays at the base level of $t_{discharge}$=30 seconds, then this results in an ultrafine change in duty cycle to 50.00000017%. The use of excess time $\Delta t$ also changes the charge-to-discharge time ratio. The total applied coulombs per frame can be calculated based on the excess time $\Delta t$. The applied coulomb rate can be calculated by dividing the total net applied coulombs per frame by the time of the frame.

The smallest increment of time possible (i.e., T) is hereinafter referred to as a tick. In the above example, the tick may be 200 nsec. In some examples, the excess time $\Delta t$ may be represented by increments of the switching timer resolution T ($k*T$), or the number of ticks "k". For example, the process controller 130 may extend the charge step by "k" ticks. The smallest quantity that may be added to or subtracted from the charge step or the discharge step is one tick, equivalent to the switching timer resolution T. By adding to or subtracting from the charge step or the discharge step certain number of ticks, the process controller 130 may maintain an output variable (e.g., current or voltage) at the desired setpoint. Another way of implementing such charge-discharge adjustment is to allow the tick count to take positive or negative values. A positive tick count represents a period with a net charge condition (e.g., longer charge time than discharge time). A negative tick count represents a period with a net discharge condition (e.g., shorter charge time than discharge time).

Compared to traditional HPC which typically requires a long cycling period (e.g., 20 hours), the cyclic coulometer system 100 may be configured to cycle the charge-discharge process in a substantially shorter cycling period (e.g., approximately 1 minute). Because of the short charge-discharge time, the electrochemical cell under test (e.g., the DUT 150) typically cannot reach the voltage limits set by traditional battery cycler techniques. Instead, the cell would be expected to oscillate above and below the initial cell voltage. As coulombic inefficiencies (self-discharge) of the cell occurs, the average cell voltage will fall below the initial cell voltage. In one example, the process controller 130 may monitor, continuously or periodically, voltage and current response of the DUT 150, optionally along with other output variables, and adjusts the net excess charge time $\Delta t$ (or the tick count) to maintain the average cell voltage at a controlled setpoint. A high-speed microcontroller with suitable timing may operate on a digital acquisition system to sample the measured battery current and voltage. The system may average both the measured input variables (e.g., charge current and discharge current) and the measured output variables (e.g., voltage and current responses of the DUT 150) to reduce noise considerably. In an example, the process controller 130 may measure total applied coulombs using a coulomb counter, or calculate the total applied coulombs directly based on the applied current and actual charge ticks. Examples of measuring total applied coulombs are discussed below, such as with reference to FIG. 5.

In various examples, the cyclic coulometer system 100 may parameterize charge loss or charge loss rate (also referred to as self-discharge rate) of an electrochemical cell (e.g., the DUT 150) at specific test conditions such as applied current (C-rate), temperature, and preset cell potentials. In an example, the cyclic coulometer system 100 may measure an amount of total charge applied, or an applied current (rate of applied coulombs), that is needed to keep the DUT 150 at a specific condition, such as substantially at a preset average cell voltage. If the average cell voltage remains in control (i.e., the average cell voltage is kept at the setpoint), then the net applied current is the charge loss rate at that specific condition of temperature, current, and cell potential. Traditional high-precision coulometry is only capable of measuring CE for an electrochemical cell that undergoes a very slow charge-discharge cycle. Coulombic inefficiency per hour (CIE/h) is a normalized metric representing an average loss rate across many possible loss mechanisms occurring across a range of cell potentials. The cyclic coulometry discussed in this document advantageously evaluates the charge loss rate in a much shorter charge-discharge cycle, and parameterizes the charge loss rate into a wide range of test conditions including C-rates, temperature, and preset cell potentials. In accordance with some examples, the charge loss rates evaluated under different cell conditions may be graphically represented as a loss rate curve or a loss rate map, examples of which are described below such as with reference to FIGS. 10A-10B.

In some examples, the cyclic coulometer system 100 may be configured to measure a transient response of the DUT 150 to a step change in current or a step change in voltage, such as by using a spectrometer, or an acoustic spectrometer, among other transducers. The step response is indicative of a frequency response of the DUT 150. Information of step response may be used to establish cell models or cell algorithms, and may provide information similar to that obtained from impedance analysis without the expense of an added instrument or needing to interrupt the cycle test. The transient response also allows cyclic coulometry to continuously monitor charge transfer resistance growth while also measuring the instantaneous loss rate at a given cell condition.

Figure 2B:
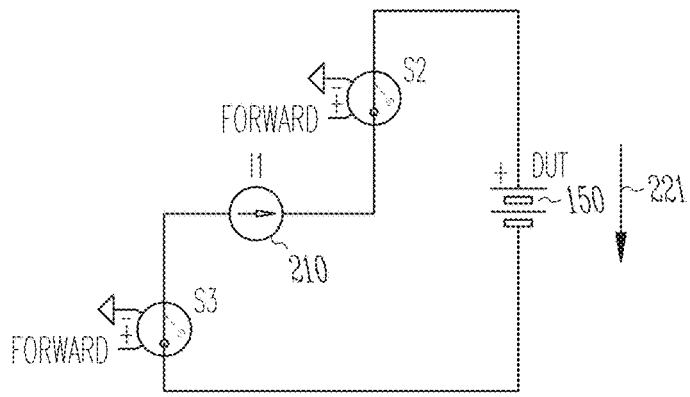
Figure 2C:
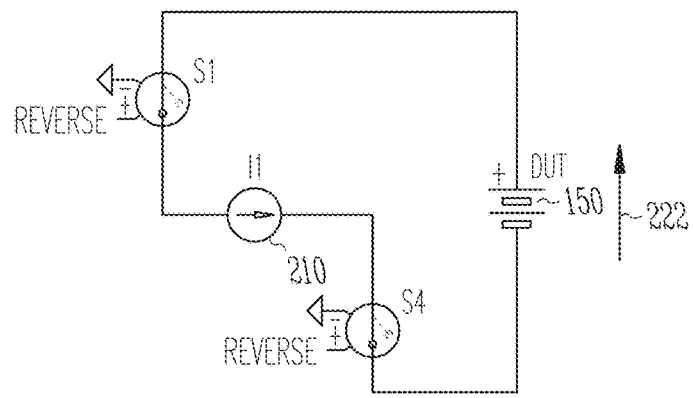

FIGS. 2A-2C are schematics illustrating an example of a portion of a current switching circuit 200 configured to provide a precisely timed polarity change at a specific current switch timing to produce charge and discharge current, a process also referred to as current steering. The current switching circuit 200 may be an embodiment of the switching circuit 120. As show in FIG. 2A, the current switching circuit includes switches S1, S2, S3, and S4, and a unidirectional DC current source 210, which is an embodiment of the current source 110. When all switches are open, no current flows to the DUT 150. FIG. 2B illustrates an equivalent circuit of the current switching circuit 200 when switches S2 and S3 are closed (as shown) and switches S1 and S4 are open, in which case the current source 210 provides a forward current 221 to charge the DUT 150. FIG. 2C illustrates an equivalent circuit of the current switching circuit 200 when switches S1 and S4 are closed (as shown)

and S2 and S3 are open, in which case the current source 210 provides a reverse current 222 to discharge the DUT 150. The arrangement of switches in FIG. 2A allows for dead time, a period when both forward and reverse timing is off. For example, if S4 and S2 are on at the same time, the DUT 150 would be short-circuited.

The switches S1, S2, S3, and S4 may be transistors or other voltage-controlled switching devices. In an example, the switches S1, S2, S3, and S4 are FET transistors, such as MOSFET transistors, and the open/close states may be achieved by applying a proper gate voltage with respect to a threshold voltage. Because the forward current 221 (charge current) and reverse current 222 (discharge current) are from the same single current source 210 which works identically during charge and discharge operations, symmetry between charge current and discharge current may be more easily and reliably achieved. Current symmetry has the benefit that offset errors present on the charging cycle cancels with the same offset present on the discharging cycle. Using the single current source also helps improve stability of current output during charge and discharge steps.

The current switching circuit 200 may change current direction (such as by opening or close one or more of the switches in FIG. 2A) in nanosecond time scale. The current switching circuit 200 has adequate voltage compliance, so that the current exhibits no substantial change in value when the polarity is switched. In an example, the current switching circuit 200 includes a clocking circuit configured to control the operations of the switches S1, S2, S3, and S4 with a specific precision to achieve fine control of current switch timing. For example, if the system clock frequency is 100 MHz, the current switch timing may have a resolution of 10 nS.

Figure 3A:
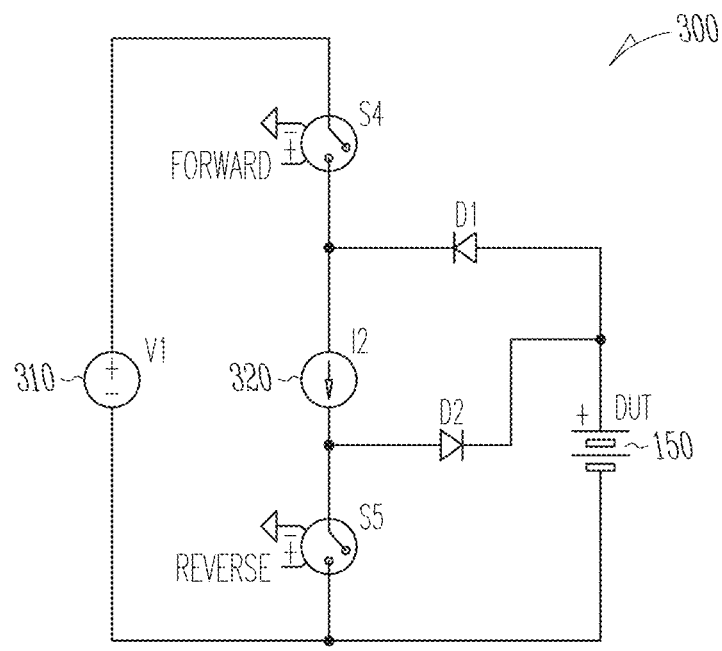
FIGS. 3A-3C are schematics illustrating another example of at least a portion of a current switching circuit configured to provide a precisely timed polarity change at a specific current switch timing to produce charge and discharge current.
Figure 3B:
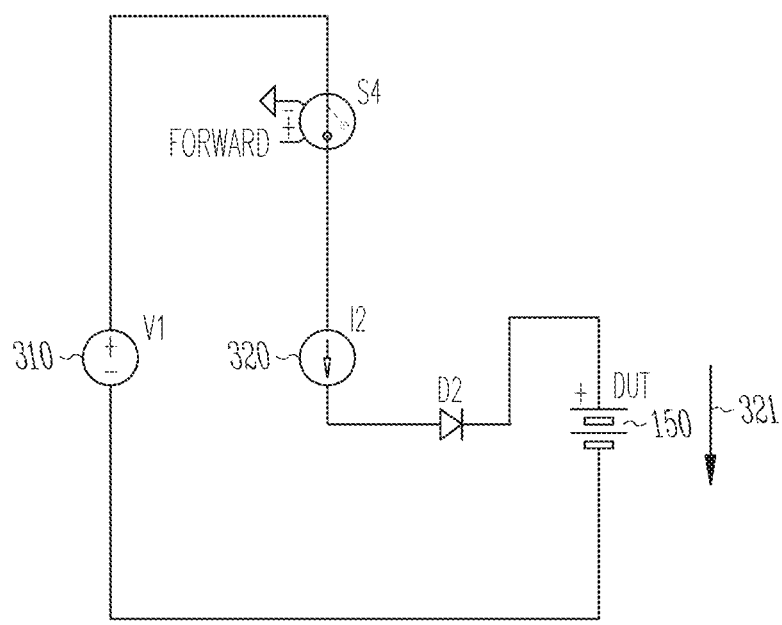
Figure 3C:
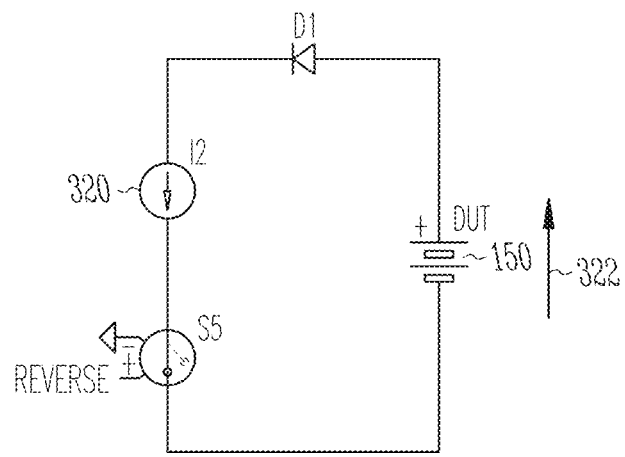

FIGS. 3A-3C are schematics illustrating another example of a portion of a current switching circuit 300 configured to provide a precisely timed polarity change at a specific current switch timing to produce charge and discharge current. The current switching circuit 300 may be an embodiment of the switching circuit 120. As shown in FIG. 3A, the current switching circuit 300 includes two switches S4 and S5, two diodes D1 and D2, a power supply 310, and a unidirectional current regulator 320. The power supply 310 and the unidirectional current regulator 320 form a current source. When both the power supply 310 and the unidirectional current regulator 320 are used, the circuit 300 may source current to the DUT 150. When only using the current regulator 320, the circuit may sink current from the DUT 150. The states of switches S4 and S5 determine which configuration occurs.

FIG. 3B illustrates an equivalent circuit of the current switching circuit 300 when switch S4 is closed and S5 is open. Diode D2 acts as a closed switch, passing forward current 321 from the power supply 310 through the regulator 320 to the DUT 150 to charge the DUT 150. FIG. 3C illustrates an equivalent circuit of the current switching circuit 300 when switch S4 is open and S5 is closed. Diode D1 acts as a closed switch in this configuration, passing reverse current 322 from the DUT 150 through regulator 320 and S5 back to the DUT 150. The reverse current 322 thus discharges the DUT 150. The advantage of this action is that the current regulator 320 operates under identical current and polarity conditions when sinking or sourcing current to or from the DUT 150, so that any small, inevitable anomalies in the current regulating circuit action cancel due to the symmetry of the circuit operation.

FIGS. 4A-4E are timing diagrams illustrating an adjustment of charge time or discharge time in a cycling period using excess time Δt. The adjustment may be performed by the switching circuit 120 in response to a control signal from the process controller 130 that schedules the excess time Δt. The cycling period (consisting of base charge time and base discharge time) and the excess charge time Δt forms a frame. In an example, the base charge time and the base discharge time are 30 seconds each, giving a cycling period of 60 seconds. The 30-second charge step is sufficiently long to allow the voltage profile to fully develop in the electrochemical cell. The excess time Δt may be represented by a number of excess timer ticks. As discussed above, a tick in this document refers to the smallest increment (or decrement) of charge time or discharge time. In an example, a tick has a duration equal to a switching timer resolution T (e.g., 200 nsec for a clock frequency of 5 MHz).

For the purpose of comparison, FIG. 4A illustrates a frame without excess time (Δt=0). The discharge operation commences immediately after the charge step. The charge and discharge steps are symmetric. FIG. 4B illustrates by way of example a positive excess charge time added to the charge step (i.e., $\Delta t_{charge}$ or excess timer ticks >0), which effectually increases the charge time from 30 seconds to 30+$\Delta t_{charge}$ seconds. The discharge operation begins immediately after the excess charge time. The frame in FIG. 4B is 60+$\Delta t_{charge}$ seconds. FIG. 4C illustrates by way of example a negative excess charge time (i.e., $\Delta t_{charge}$ or excess timer ticks <0), which effectually decreases the charge time from 30 seconds to 30−$\Delta t_{charge}$ seconds. The discharge step begins immediately after the shortened charge step. The discharge time remains to be 30 seconds. As such, the frame in FIG. 4C is 60−$\Delta t_{charge}$ seconds, which is less than 60 seconds.

Likewise, the excess time may be applied to the discharge step. FIG. 4D illustrates by way of example a positive excess discharge time added to the discharge step (i.e., $\Delta t_{discharge}$ or excess timer ticks >0), which effectually increases the discharge time from 30 seconds to 30+$\Delta t_{discharge}$ seconds. The frame in FIG. 4D is 60+$\Delta t_{discharge}$. FIG. 4E illustrates by way of example a negative excess discharge time (i.e., $\Delta t_{discharge}$ or excess timer ticks <0), which effectually decreases the discharge time from 30 seconds to 30−$\Delta t_{discharge}$ seconds. The frame in FIG. 4D is 60−$\Delta t_{discharge}$, which is less than 60 seconds. The cyclic coulometer system 100 may repeat continuously frame after frame, and update the excess charge time variable for each frame.

Figure 5:
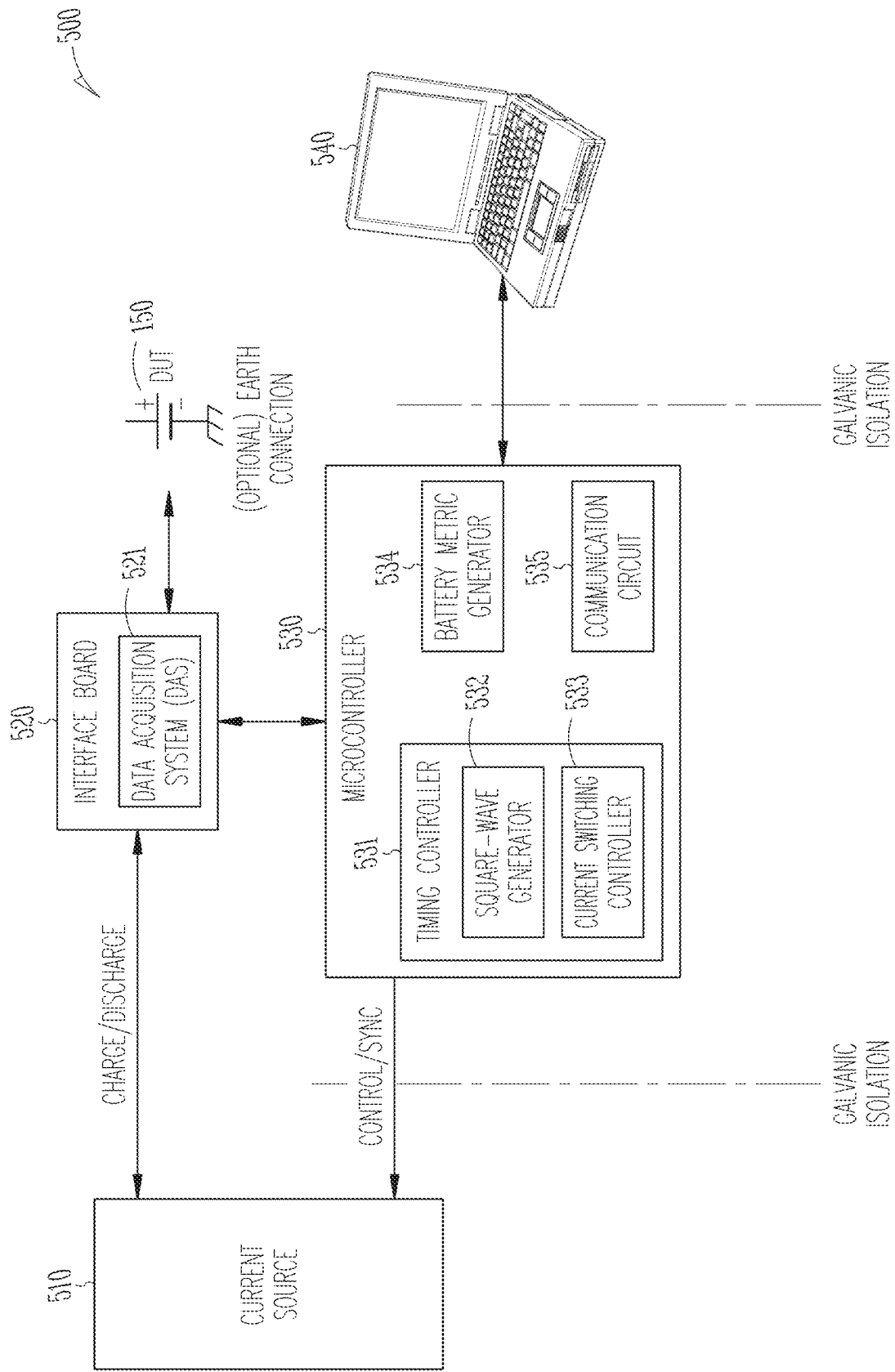
FIG. 5 is a block diagram illustrating an example of a battery testing system for diagnostic test using the cycle coulometer system of FIG. 1.

FIG. 5 is a block diagram illustrating an example of a battery testing system 500 configured to perform diagnostic testing of an electrochemical cell, such as the DUT 150 as shown, using cycle coulometry as discussed above with reference to FIG. 1. The battery testing system 500 may include one or more of a current source 510 to provide charge and discharge current during testing, an interface board 520 to engage with the DUT 150, and a microcontroller 530 to provide control signals to operate various components and circuitry of the system 500, perform data processing, evaluate battery performance metrics, and generate battery diagnostics. In an example, to ensure temperature stability, some or all of the circuit components of the battery testing system 500 may be contained in a precise temperature-controlled environment with the temperature stabilized to <±0.1° C.

The current source 510, which is an embodiment of the current source 110 of FIG. 1, may provide charge current and discharge current for the DUT 150 during a cycle test. In an example, the current source 110 may be a single unipolar current source configured to provide DC current.

Amplitude of the current may be adjustable such as via the microcontroller 530. Examples of the unipolar current source are discussed above with reference to FIGS. 2A-2C and FIGS. 3A-3C.

The interface board 520 may engage the DUT 150 to the testing system 500 using 2-wire, 3-wire, or 4-wire connections, apply the charge and discharge current to the DUT 150, and measure current and voltage from the DUT 150, among other variables. As illustrated in FIG. 5, the interface board 520 may include a data acquisition system (DAS) 521 configured to sample and digitize analog measurements, under the control of the microcontroller 530. In various examples, the DAS 521 has a dynamic range large enough to digitize the charge current and the discharge current, and simultaneously has a resolution fine enough to detect the signal of interest. In an example, to improve accuracy of batter diagnostics, the performance of the DAS 521 has a performance exceeding the current source 510, so that source of errors that would arise from the testing may be precisely determined. Examples of the DAS 521 are discussed below with reference to FIG. 7. In an example, the interface board 520 may be physically separated from the microcontroller 530 and the DAS 521 to allow for flexible resistive sensing and current source options for various battery sizes.

In some examples, the interface board 520 may include an embedded temperature sensor (not shown) to measure the temperature of the environment of the DAS 521. Based on the monitored temperature, the microcontroller 530 may adjustably provide a thermally stable environment for the circuitry, such as regulating the temperature of the DAS 521 using power resistors surrounding the DAS 521 on the interface board 520.

The microcontroller 530, which is an embodiment of the process controller 130, may be programmed to control the current source 510 to generate specific charge-discharge current, drive the data acquisition on the DAS 521, supervise the cycling process, and generate battery metrics. The microcontroller 530 may include communication peripherals to communicate with an external monitor 540 to respond to commands and report measurement results. In an example, the battery testing system 500 is operated on a 16 MHz temperature compensated crystal oscillator (TCXO), which drives the microcontroller 530 and the analog-to-digital converter (ADC) of the DAS 521 directly. The microcontroller 530 may use a phase-lock loop to raise 16 MHz to an internal frequency of 40 MHz system clock, which is divided down by 8 to 5 MHz. This 5 MHz is as accurate as the applied crystal clock, and clocks a 32-bit timer used to generate the charge and discharge periods with a time resolution of T=200 nsec. For example, a 2-second period cycle has one second or $5*10^6$ ticks each having a duration of 200 nsec (a resolution of 0.2 ppm). The high-speed microcontroller 530 with suitable timing may operate the DAQ 521 to sample both the battery current and voltage.

The microcontroller 530 may be implemented as parts of a microprocessor circuit, which may be a dedicated processor such as a digital signal processor, application specific integrated circuit (ASIC), microprocessor, or other type of processor for processing information including physical activity information. Alternatively, the microprocessor circuit may be a general-purpose processor that may receive and execute a set of instructions of performing the functions, methods, or techniques described herein.

The microcontroller 530 may include circuit sets comprising one or more other circuits or sub-circuits, including a timing controller 531, a battery metric generator 534, and a communication circuit 535. The circuits or sub-circuits may, alone or in combination, perform the functions, methods, or techniques described herein. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

The timing controller 531 may include a square-wave generator 532, coupled to the current source 510 to generate square-wave current for application during charge and discharge cycles. The square-wave generator 532 may include switches that operatively open or close at scheduled time, thereby altering the current directions, examples of which are discussed above with reference to FIGS. 2A-2C and FIGS. 3A-3C. The timing controller 531 may include a current switching controller 533 configured to adjust at least one of the charge time or the discharge time, such as by changing a current switch timing between the charge and discharge steps in a cycling period, to keep an output variable (e.g., an average cell voltage) at a preset setting. As discussed above with reference to FIG. 1, the timing control of current switching may include an excess time Δt, represented by time duration or by a count of excess timer ticks, added to or subtracted from charge time or discharge time (as illustrated in FIGS. 4B-4E).

In various examples, the current switching controller 533 may adjust at least one of the charge time or the discharge time, or update current switch timing based on one or more input variables, or cell conditions such as state of charge or state of health, to accelerate convergence of the electrochemical cell to a setpoint defined in the system controller. In an example, the current switching controller 533 may correct an initial current switch timing (which may be set to an empirical value such as estimated from the process control algorithm) using battery metrics and diagnostic information obtained from the battery metric generator 534 to achieve faster control. In an example, the current switching controller 533 may utilize information from many output variables (e.g., in-frame voltage and current responses of the DUT 150) to predict an appropriate timing control strategy. For example, in response to a disturbance in the measured average cell voltage, the current switching controller 533 may use prior measurements for the cell resistance and the in-frame voltage response to drive the DUT 150 back to the setpoint more quickly. System controllers, such as PI control, PID control, among other feedforward or feedback controllers, may be used to expedite the convergence of the measured output variable to a desired setpoint with little overshoot or oscillation. The battery metrics and diagnostic information, and the control strategy discussed above, may also be used to adjust the operation of various elements of the system 500, such as data acquisition at the DAQ 521.

The microcontroller 530 and the DAS 521 may require various voltages for proper operation. In some examples, medical grade power converters, such as cardiac-floating "CF" type converters, may be used isolate AC power from the current source 510, the microcontroller 530, and the DAS 521, with little line frequency leakage current. Galvanic isolation barriers may be provided to isolate the microcontroller 530 (e.g., precise instrumentation therein such as coulomb counter) from the external monitor 540 and the current source circuitry 510. As the current source is reversed from charge to discharge configuration, the isolation from the current source circuitry 510 may allow the current source 510 to be reversed from charge to discharge configuration.

The battery metric generator 534 may be configured to generate battery metrics and diagnostic information using the measurements provided by the DAS 521. The battery metric generator 534 and the DAS 521 are collectively referred to as measurement circuitry that performs signal measurement and processing. In an example, at least a part of the battery metric generator 534 may be configured as a precision coulomb counter to count charges during the charge and discharge cycles. In an example, the coulomb counter may employ a precision voltage reference. The system may average the measured input variables and the measured output variables to reduce noise considerably.

In an example, the battery metric generator 534 may determine an amount of total charge applied per frame (QPF, in coulombs). The summation of the frame coulombs represents the cumulative coulombs applied during the battery cycle test. In an example, the QPF may be calculated using the output of the DAS 521. In another example, the battery metric generator 534 can calculate the QPF by integrating applied current over the entire frame. In an example, the QPF may be calculated using Equation (1):

$$QPF = \int_0^{tframe} i(t)dt \quad (1)$$

In some examples, the battery metric generator 534 may alternatively calculate an amount of total charge applied during charge ($Q_{charge}$) and the total charge applied during discharge ($Q_{discharge}$). In this case, the battery metric generator 534 may calculate an amount of total charge applied during charge ($Q_{charge}$) by integrating the applied current over only the charge period. Likewise, the battery metric generator 534 may calculate an amount of total charge applied during discharge ($Q_{discharge}$) by integrating the applied current over only the discharge period. The QPF can then be calculated using Equation (2):

$$QPF = Q_{charge} - Q_{discharge} \quad (2)$$

In an example, $Q_{charge}$ may be calculated using average charge current $I_{charge}$ and a total tick count during charge (N_tick$_{charge}$), as given in Equation (3). In an example, $Q_{discharge}$ may be calculated using average discharge current $I_{discharge}$ and a total tick count during discharge (N_tick$_{discharge}$), as given in Equation (4).

$$Q_{charge} = T * \text{N\_tick}_{charge} * I_{charge} \quad (3)$$

$$Q_{discharge} = T * \text{N\_tick}_{discharge} * I_{discharge} \quad (4)$$

The clock time per tick T is equal to the switching timer resolution ($T = 1/f_{clock}$). In an example, the time per tick is T=200 nsec for a system clock frequency $f_{clock}$=5 MHz.

In another example, the square wave generator 532 can implement a symmetric waveform from a single unipolar current source, such that the average charge current and discharge currents are substantially identical over the timescale of the frame. The current switching controller 533 can apply excess charge ticks $\Delta\text{tick}_{charge}$ or excess discharge ticks $\Delta\text{tick}_{discharge}$. In this example, the QPF may be calculated by using the average source current (I) and the difference in the excess tick count between the charge and discharge periods, as given in Equation (5).

$$QPF = T * (\Delta\text{tick}_{charge} - \Delta\text{tick}_{discharge}) * I \quad (5)$$

In another example, the microcontroller 530 may provide for excess charge $\Delta\text{tick}_{charge}$ as directed by a PI or PID control algorithm to maintain a predetermined average cell voltage. The integral term of the PI or PID controller is used to minimize steady-state error or offset from the average cell voltage setpoint. If the system is in control and the system control algorithm is well-tuned, the integral term is a smoothed estimate of excess charge $\Delta\text{tick}_{charge}$ added per frame. That is, the integral term is both the control variable (timing) as well as the basis of the total charge per frame (QPF) and total applied coulomb rate. This is a beneficial feature of the cyclic coulometer as even with noisy current sources or measured output variables, smooth coulomb and total charge applied values may be obtained due to the behavior of the integral term of a PI or PID control algorithm. In an example, the QPF may be calculated by the average source current (I), the clock time per tick (T), and integral value (INT) of the PI or PID algorithm used to generate the frame timing, as given in Equation (6).

$$QPF = T * \text{INT} * I \quad (6)$$

In some examples, the battery metric generator 534 may trend QPF over time to generate a total coulomb curve plotted versus time. A slope of the total coulomb curve at a particular time represents an effective applied current (also referred to as applied coulomb rate, self-discharge rate, or loss rate) needed to maintain the system in control (e.g., an output average cell voltage being kept at a control level). Examples of total charge applied and self-discharge rate are discussed below, such as with reference to FIG. 8.

In an example, the battery metric generator 534 may determine an equivalent series resistance (ESR) of the DUT 150, as a function of total charge applied. The ESR may be calculated using a change in cell voltage ($\Delta V$) (such as obtained from the cell voltage response of the charge or discharge step compared to the average cell voltage 810) and the magnitude of the applied current ($\Delta I$). The cell voltage used for calculating the ESR may be represented by an average voltage of an entirety of the cycling period, or alternatively an average or terminal voltage of only the charge cycle or the discharge cycle. In an example, the ESR may be calculated based on one half of the difference in the charge and discharge voltages and calculated symmetrically around the current switching divided by the applied current used during the charge and discharge steps. The battery metric generator 534 may additionally parameterize the ESR as a function of an amount of total charge applied (such as by generating an ESR curve over different values of total charge applied), and determine an ESR change rate per lost coulomb, representing a rate of ESR change over a change in total charge applied (dESR/dQ), examples of which are discussed below with reference to FIG. 9.

In addition to or in lieu of the QPF, the total charge applied, the self-discharge rate, the ESR, and the ESR change rate as discussed above, the battery metric generator 534 may generate other battery metrics or diagnostic information, such as frequency response of the DUT 150. The battery metric generator 534 may generate the battery metrics according to the electrochemical test being performed and/or the monitoring devices being used. In some examples, the battery testing system 500 may include a spectrometer, an ultrasound source and sensor, a fiber optic cable, or a pressure transducer, among others.

The communication circuit 535 is configured to establish data communication with a monitor device 540, such as a personal computer (PC) or a mobile device, that may perform data processing, storage, and presentation of the battery metrics and diagnostic information to a system user (e.g., materials developers, cell designers, cell manufacturers, algorithm battery engineers, and quality control and reliability engineers, among others). The battery metrics and diagnostic information may be presented in a table, a chart, a trend, a diagram, or any other types of textual, tabular, or graphical presentation formats. For examples, graphs on FIGS. 8 and 9, or variants thereof, may be presented on a display of the monitor device 540. In an example, the monitor device 540 may present the total charge applied and/or the self-discharge rate under individually addressable and specified test conditions, such as different C-rates, different temperatures, different setpoint voltage, or any combination of these variables among others. For example, a loss rate curve or a loss rate map as shown in FIGS. 10A-10B may be presented on a display of the monitor device 540. The monitor device 540 may generate alert notification of status of the DUT 150. The monitor device 540 also include a user interface to allow a system user to monitor the cycling process (either online or offline monitoring), and program the cyclic coulometry with input commands to the microcontroller 530, such as programming one or more test condition variables (e.g., a C-rate, a cell voltage setpoint, or a temperature setpoint). In some examples, at least a portion of the battery metric generator 534 may be implemented in the monitor 540, which may perform online measurements of battery metrics.

Figure 6A:
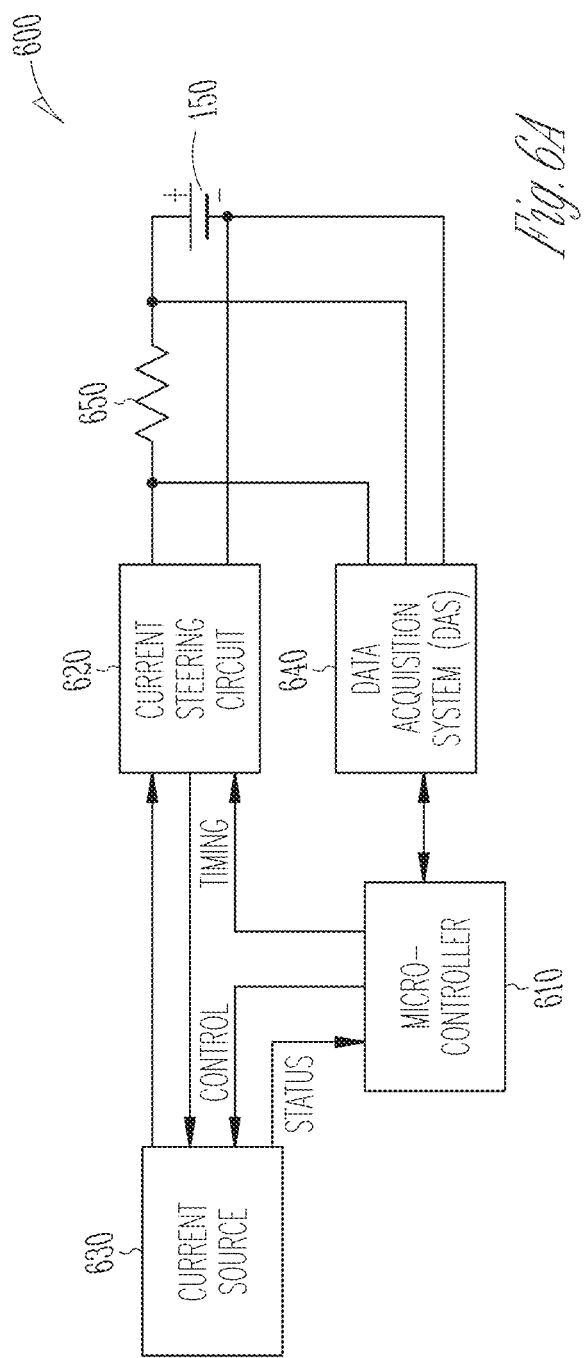
FIG. 6A is a diagram illustrating an example of at least a portion of a current steering circuit configured to control the current switch timing between charge and discharge cycles.
Figure 6B:
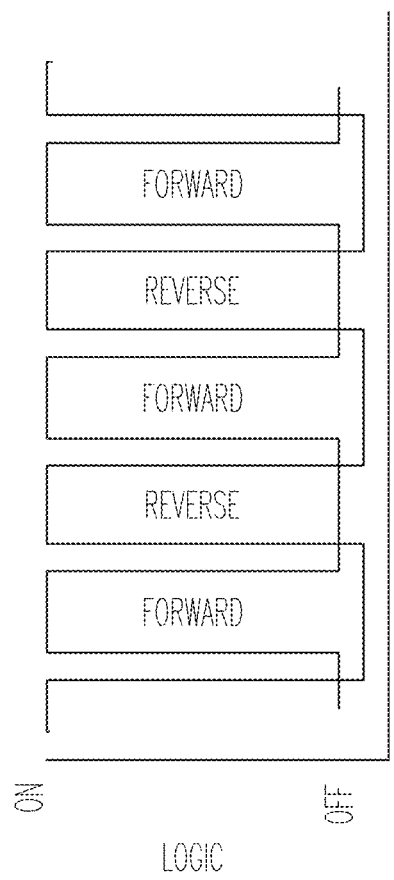
FIG. 6B is a timing diagram illustrating by way of example logic timings of forward (charge) current and reverse (discharge) current produced by the current steering circuit of FIG. 6A.

FIG. 6A is a diagram illustrating an example of at least a portion of a current steering circuit 600 configured to control the current switch timing between charge and discharge steps during a cycle test. The current steering circuit 600, which is an embodiment of the switching circuit 120 of FIG. 1, includes a microcontroller (MCU) 610, which is an embodiment of the current switching controller 533. The microcontroller 610 is coupled to the current source 630, an embodiment of the current source 110, that may generate square waves to excite the DUT 150 during a cycle test. The microcontroller 610 may generate a timing control signal for current steering circuit 620, which includes switches (e.g., FET transistors or other types of voltage-controlled switches, such as illustrated in FIGS. 2A-2C and 3A-3C) to implement current switching according to the timing control signal provided by the microcontroller 610. Forward (charge) current and reverse (discharge) current may be applied to the DUT 150. FIG. 6B is a timing diagram illustrating by way of example logic timings of the forward current and the reverse current from the current steering circuit 620. The forward current and reverse current alternate at scheduled time in accordance with the current switch timing.

Electrical parameters such as voltage of the DUT 150, voltage across a current sensing resistor 650, and the applied current through the DUT 150 may be measured using data acquisition system (DAS) 640. The DAS 640 may include an analog-to-digital converted (ADC) to convert the analog measurements into digital data at specified precision level, and stored in a data storage device. In an example, the DAS has a dynamic range large enough to digitize the charging/discharging current and simultaneously have resolution fine enough to detect the signal of interest. In an example, the performance of the DAS 640 may exceed the performance of the current source 630, such that the cyclic coulometry process may more reliably determine the source of errors that may arise during the cycle test.

The digital data may be preprocessed using techniques such as over sampling, filtering, or noise shaping, among others, to increase data precision and improve data quality. The digital data may be used, such as by the battery metric generator 534, to produce new data forms and performance specifications, and/or to generate battery metrics and diagnostics that characterize the state of charge or the state of health of the DUT 150, among other conditions of interest. In some examples, the microcontroller 610 may update current switch timing using one or more of information about status of the current source 630, measurements from the DAS 640, and the battery metrics and diagnostics from the battery metric generator 534.

Figure 7:
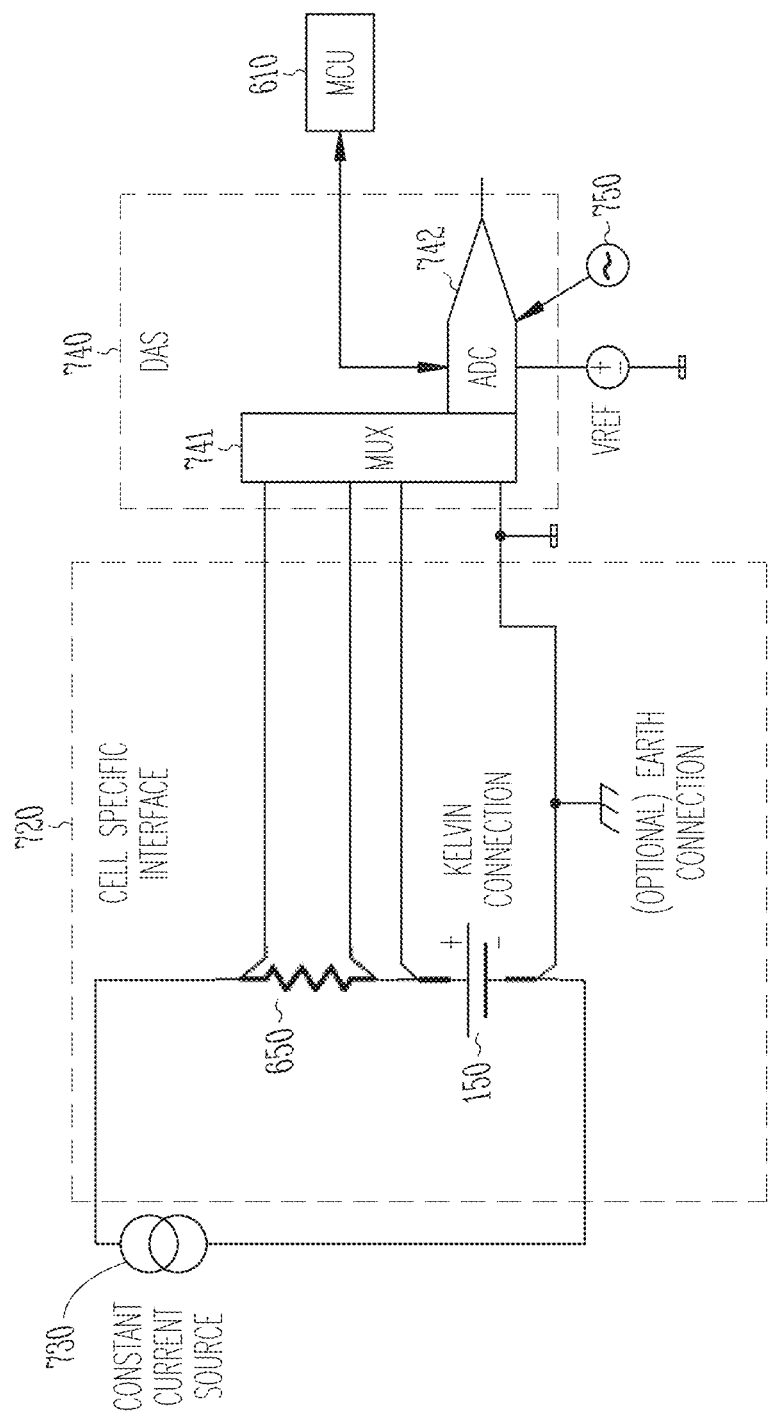
FIG. 7 is a diagram illustrating a data acquisition system (DAS) for measuring electrical parameters in a cycle test and at least a portion of the environment in which the DAS is operated.

FIG. 7 is a diagram illustrating a data acquisition system (DAS) 740 for measuring electrical parameters in a cycle test and at least a portion of the environment in which the DAS 740 is operated. The DAS 740 may be an example of the DAS 521 as illustrated in FIG. 5, or the DAS 640 in FIG. 6. Constant current source 730, which is an embodiment of the current source 630, provides excitation current to the DUT 150. Cell specific interface 720 is a physical interface with the DUT 150, and may be implemented in the interface board 520. The DAS 740 includes a multiplexer (MUX) 741 to select among analog measurements, such as cell voltage of the DUT 150 and cell current based on voltage across the current sensing resistor 650 with known resistance, as discussed above with reference to FIG. 6. The DAS 740 includes an analog-to-digital converter (ADC) 742 to digitize the analog measurements (e.g., voltage or current). In an example, the ADC 742 may operate with a precision voltage reference (Ver) and a 16 MHz timing source 750. In an example, the ADC 742 is configured to continuously provide digitized voltage and current samples at a specific sampling rate, such as 1250 samples per second (SPS).

In an example, the ADC 742 is configured for 32-bit conversion, of which 28 bits are used by a coulomb counter. At this data rate and with the 2.5V reference, the ADC 742 is quiet to about 20 bits, such that the samples being taken at 1250 SPS may be quiet to about 2 ppm. Averaging after that may reduce noise considerably. For example, even with very short frame (period of 2 seconds), each half has about 1250 samples. This decimation is approximately equivalent to an additional 4 bits of resolution.

The DAS 740 may output digitized measurements to the MCU 610. Various metrics and diagnostic information may be generated (e.g., by the battery metric generator 534) based on said measurements, including actual coulomb applied per step, the average voltage of the charge step, the average voltage of the discharge step, the average cell potential, the equivalent series resistance calculated from the charge step, the equivalent series resistance calculated symmetrically around the current switching, the equivalent series resistance calculated from the discharge step, integral value and the proportional term of the system controller (that is, the "P" and "I" terms in a PI controller or a PID controller), etc. Examples of the battery metrics are discussed below, such as with reference to FIGS. 8, 9, and 10A-10B. The system may be determined to be in control when the average cell potential is substantially the same as the setpoint. When in control, the average proportional term (P) goes to zero.

Figure 8:
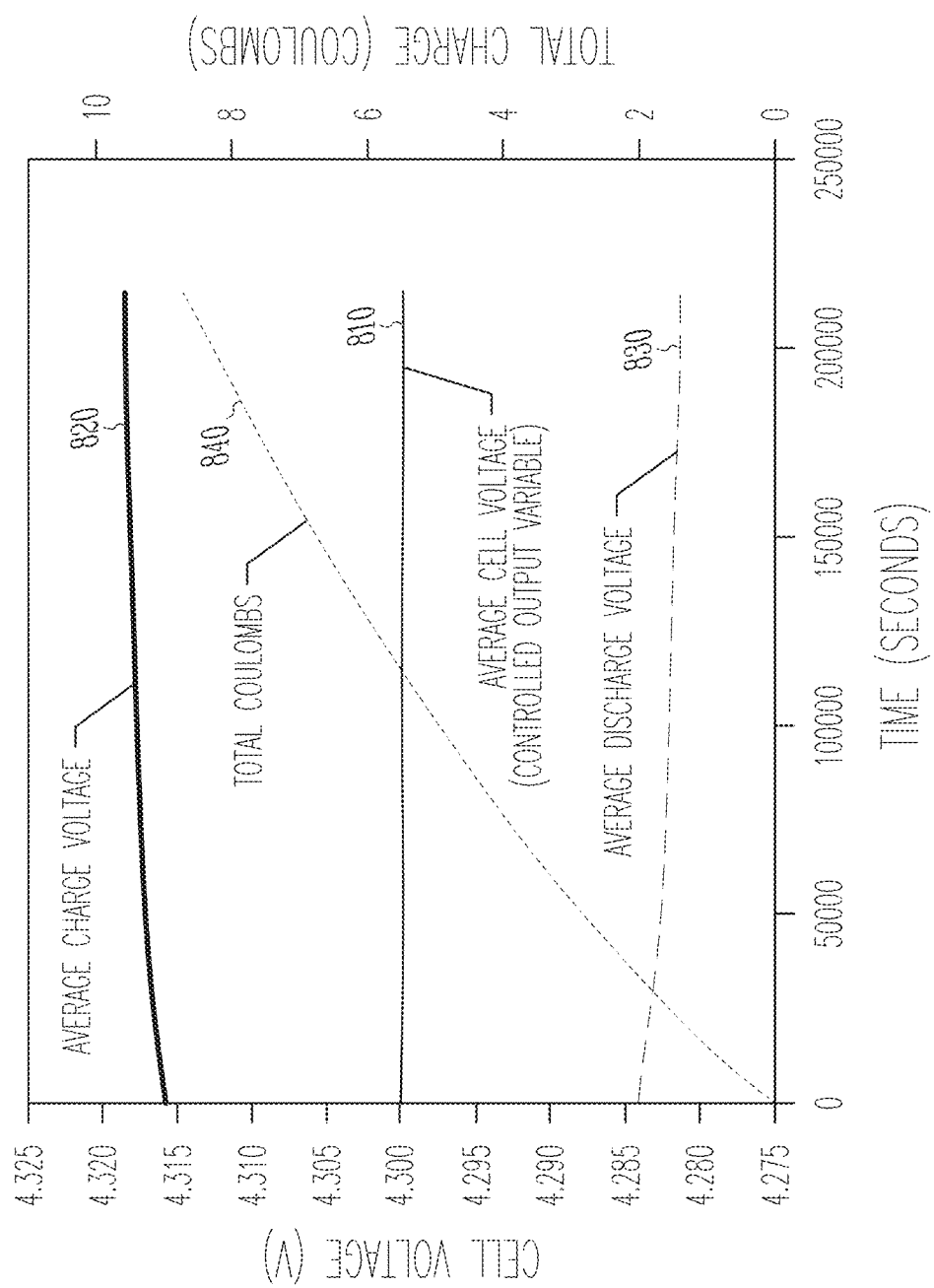
FIG. 8 is a graph illustrating, by way of example and not limitation, voltage and current responses during a cycle test, such as obtained using the testing system of FIG. 5.

FIG. 8 is a graph illustrating, by way of example and not limitation, voltage and current responses during a cycle test performed on a battery under test, such as obtained using the system 500. By way of example and not limitation, following method may be used to assemble the battery under test. The cathode inks were made using a Thinky ARE-500 planetary mixer. Then, 9.42 grams of NMC532 cathode, 0.340 grams Timcal C65 carbon black, and 0.240 grams of PVDF were added to a Thinky mixing cup. Then, 6.85 grams of NMP was added and the mixture was spun at 1000 RPM for a total of 10 minutes with two short pauses added to prevent excessive heating of the ink. The cathode inks were then cast on aluminum foil, dried, and cut into electrodes.

The cast and dried cathodes were used to construct handmade pouch Li-ion test cells using graphite anodes. After degassing, the assembled batteries were filled with an electrolyte. The electrolyte used in this example was a 1M LiPF6 in a mixture of ethylene carbonate, ethyl methyl carbonate, and diethyl carbonate (EC/EMC/DEC 3/5/2 v/v) and included 1% vinylene carbonate.

The cycle test was performed on a battery cell thus made. The cell was charged to 4.3V and put onto test using cyclic coulometry as described above with reference to FIGS. 1 and 5. The cyclic coulometry was run with a 60-second cycling period (30-second base charge time and 30-second base discharge time), and a C-rate of 0.5C (i.e., a 2-hour charge rate). The PI controller may be instructed to maintain the average cell voltage at 4.3V (the setpoint). The cell was placed into an oven at 45° C. and allowed to equilibrate.

Average cell voltage, charge voltage, and discharge voltage may be continuously monitored, and data acquired such as by using the system 500. As illustrated in FIG. 8, the microcontroller 520 (e.g., a PI controller) adjusts the timing variables to maintain the output average cell voltage at the desired set voltage. The average cell voltage response 810 maintains at a setpoint of approximately 4.3V. Average charge voltage response 820, measured during the first half of the cycling period, increases over time. Likewise, average discharge voltage response 830, which is obtained during the second half of the cycling period, decreases over time. That is, average charge and average discharge voltage both grow overtime during the cycle test.

Also shown in FIG. 8 is a total coulombs curve 840 that represents the cumulative charge applied (scales shown on the second Y-axis) at different times during the cycle test. The total charges applied increase with time. The total charge applied is the summation of the total charge applied per frame (QPF). As discussed above with reference to FIG. 5, the QPF may be determined using a coulomb counter, or alternatively calculated by integrating the current corresponding to the number of ticks required per frame to keep the average cell voltage at a set level (e.g., 4.3V in this example), as given in Equation (1). In some examples, the total applied charges may be calculated for the charge step only, or the discharge step only, as given in Equations (3) and (4). The QPF may alternatively be calculated using one of the Equations (2), (5), or (6).

An applied coulombs rate, which is an effective charge or discharge current used for each cycling period of the cyclic coulometry, may be determined using the total coulombs curve 840. The applied coulombs rate changes cycle to cycle of the cyclic coulometry. The effective coulomb rate may be averaged across cycle periods. When a battery under test is stabilized at a set cell condition (e.g., average cell voltage of the battery is substantially maintained at the voltage setpoint of 4.3V, in this example), the applied coulomb rate from cyclic coulometry needed to maintain the stable cell condition on average is referred to as a self-discharge rate at that condition. In an example, the self-discharge rate (or loss rate) may be determined using a slope of the total coulombs curve 840 at a particular time (dQ/dt). In the present example, a steep slope of the total coulombs curve 840, thus a higher self-discharge rate, is observed at the earlier stage (e.g., before 100,000 seconds) than the later stage (e.g., after 100,000 seconds) of the test. This could be due to the cell becoming more efficient slowly overtime as the solid-electrolyte interphase (SEI) further develops, or the cathode becomes less reactive.

The voltage and current responses, such as the average cell voltage 810, the charge voltage 820, the discharge voltage 830, and the total coulombs curve 840, may be obtained under individually addressable and specified test conditions. Each test condition may be represented by one or more control variables (e.g., C-rate, temperature, cell voltage setpoint during the cycling process) each taking a plurality of values. For example, the voltage and current responses shown in FIG. 8 were obtained under a specific test condition defined by a parameter set: (C-rate=0.5C, temperature=45° C., average voltage setpoint=4.3V). A different set of voltage or current responses may be generated under a different test condition, such as by varying one or more of the C-rate, temperature, or cell voltage setpoint.

Figure 9:
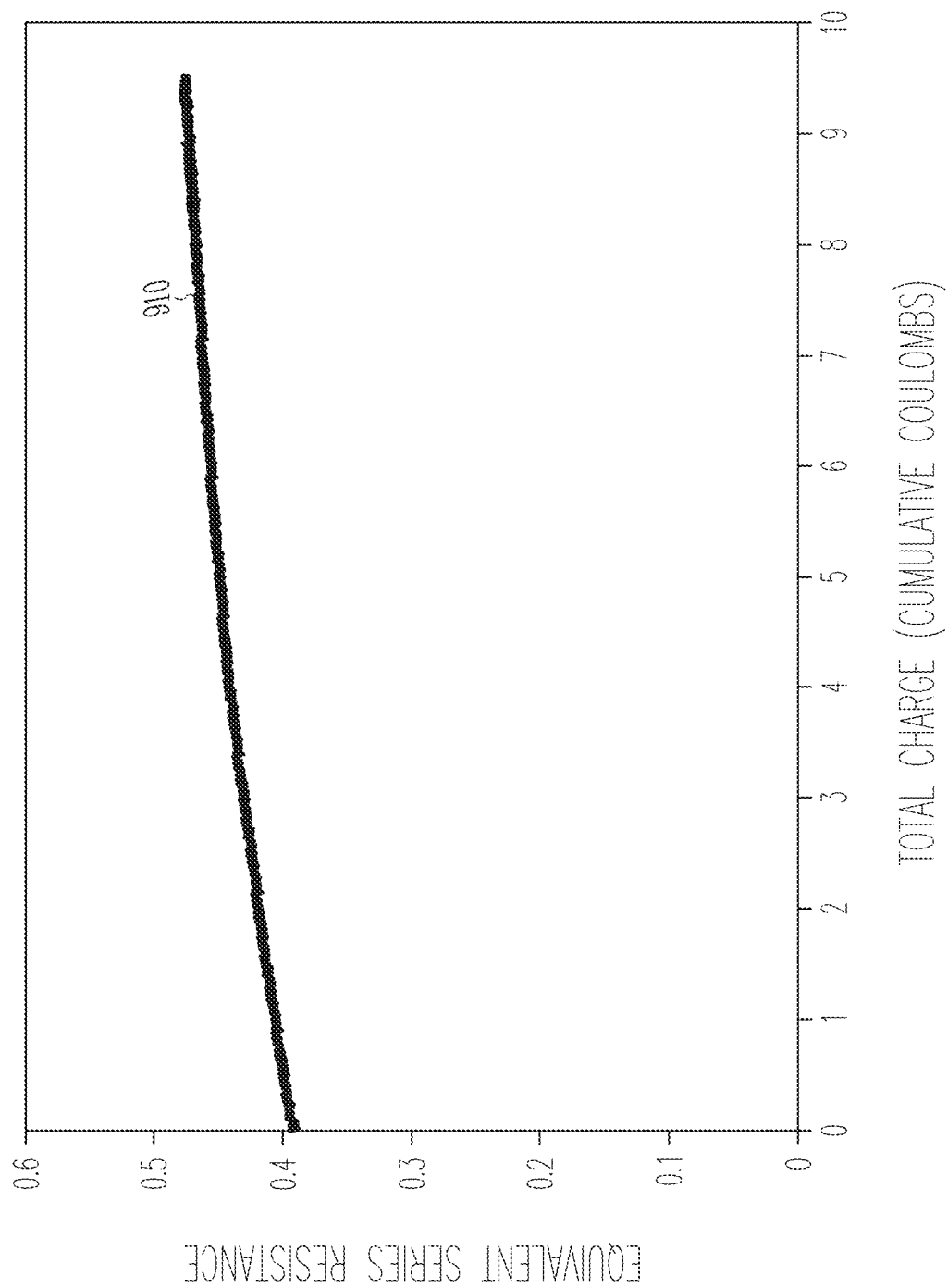
FIG. 9 is a graph illustrating, by way of example and not limitation, equivalent series resistance (ESR) of a cell under test plotted versus the amount of total charge applied.
Figure 10A:
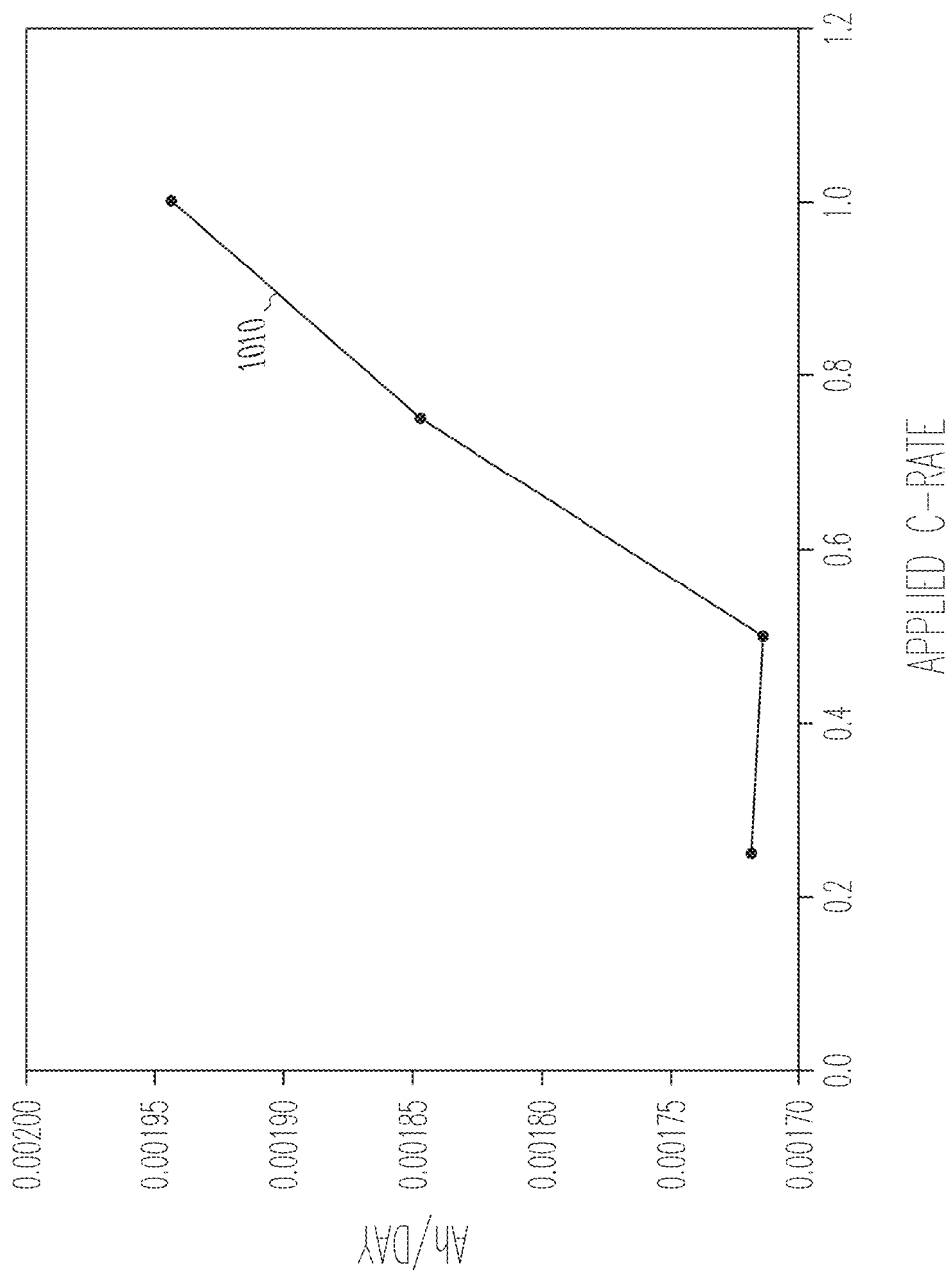
FIGS. 10A-10C illustrate, by way of example and not limitation, graphical representations of performance metric, such as a self-discharge rate or an ESR change rate, calculated under different test conditions.
Figure 10B:
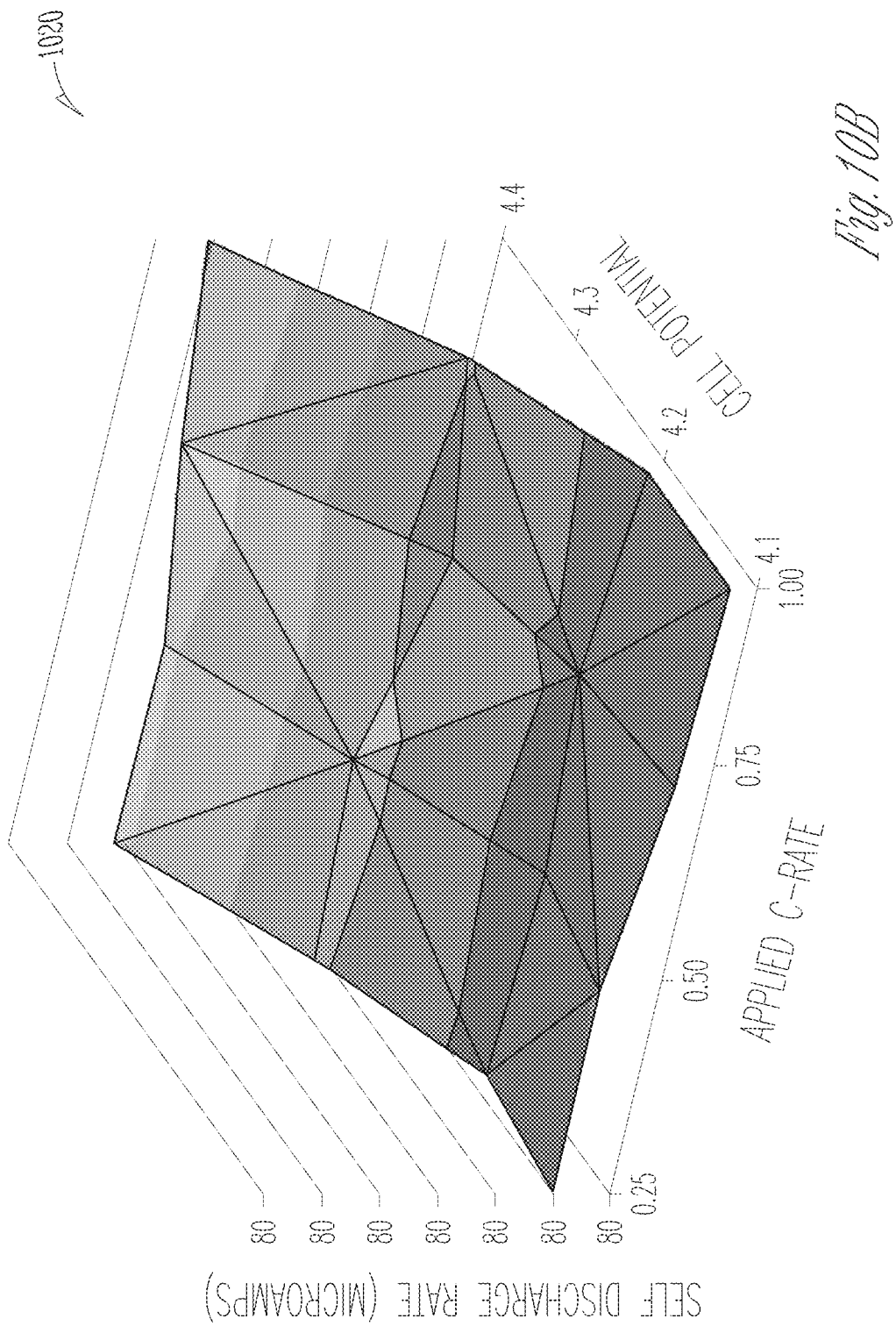

FIG. 9 is graph illustrating, by way of example and not limitation, equivalent series resistance (ESR, in Ohms) of a cell under test plotted versus the total charge applied (cumulative coulombs as represented by the total coulombs curve 840 of FIG. 8), both of which were determined using the measurements from the cycle test as described above with reference to FIG. 7. The ESR may be determined using a change in cell voltage and a change in current ($\Delta I$) during the charge period or the discharge period. In an example, the ESR may be calculated using a ratio of a difference between the average charge voltage ($V_{charge}$) 820 and the average cell voltage ($V_{average}$) 810 to a charge current ($I_{charge}$), as given in Equation (7). Alternatively, the ESR may be calculated using a ratio of a difference between the average discharge voltage ($V_{discharge}$) 830 and the average cell voltage ($V_{average}$) 810 to a discharge current ($I_{charge}$), as given in Equation (8).

$$ESR = (V_{charge} - V_{average})/(I_{charge}) \quad (7)$$

$$ESR = (V_{discharge} - V_{average})/(I_{discharge}) \quad (8)$$

The average cell voltage, $V_{average}$, represents an average voltage of an entirety of the cycling period. In an example, $V_{average}$ may be determined using an average of the charge and discharge voltages. Alternatively, $V_{average}$ may be determined using a weighted average of $V_{charge}$ and $V_{discharge}$. The weight factors for $V_{charge}$ and $V_{discharge}$ may be respectively determined using the number of ticks during charge (N_tick$_{charge}$) and the number of ticks during discharge (N_tick$_{discharge}$), respectively, as given in Equation (9).

$$V_{average} = \frac{V_{charge} * \text{N\_tick}_{charge} + V_{discharge} * \text{N\_tick}_{discharge}}{\text{N\_tick}_{charge} + \text{N\_tick}_{discharge}} \quad (9)$$

Alternatively, the cell voltage used for calculating the ESR may be calculated using an average or terminal voltage (maximum voltage) of the charge cycle and the average or terminal voltage of the discharge cycle. In another example, the cell voltage for calculating the ESR may be obtained by calculating an average charge voltage and an average discharge voltage symmetric around the current switch with respect to time. In these examples, a difference between $V_{charge}$ and $V_{discharge}$ is divided by two and the applied current (I), as given in Equation (10).

$$ESR = (V_{charge} - V_{discharge})/(2*I) \quad (10)$$

As illustrated in FIG. 9, the ESR increases as self-discharge reactions accumulate in the cell. The slope of the ESR curve 910 represents ESR change rate per lost coulomb (dESR/dQ), which is an indicator of how damaging each lost coulomb is to cell resistance. In this cycle test, the cycling period was set to 60 seconds. Due to the time scale, calculation of ESR would provide a direct measurement of the low frequency resistance of a battery cell during actual charge transfer. Given that empirical correlations for cycle life require data on both the loss rate and the growth in charge transfer resistance, cyclic coulometry discussed herein represents a significant improvement to the state-of-the-art battery metrology. In particular, cyclic coulometry discussed herein allows the experimentalist to measure the change in the ESR of the test cell as a function of lost coulombs, a coulometry that advantageously quantifies how damaging each lost coulomb is to cell resistance in a continuous manner.

As discussed above with reference FIG. 8, the total coulombs curve 840 and the self-discharge rate derived from the curve 840 may be obtained under an individually addressable and specified test condition. In some examples, multiple loss rates may be determined at different test conditions. Each test condition may be represented by a parameter set including one or more of a C-rate value, a temperature measurement, or a cell voltage setpoint, among other variables. Each parameter may take a plurality of values, such as a plurality of C-rates, a plurality of temperatures, or a plurality of setpoint voltage. The resulting loss rates may be expressed as a parameterized representation over one or more of said variables. In an example, the parameterized representation includes a multidimensional array. In another example, the parameterized representation includes a multidimensional graph, such as a loss rate curve or a loss rate map or surface, examples of which are discussed below with reference to FIGS. 10A-10B.

In some examples, the loss rate may be represented by an amount of charge loss per day (Ah/day) that is required to maintain the test cell at the setpoint potential. Conventionally, loss rate of energy storage is represented by a voltage fade. Voltage fade generally requires interpretation, thus does not provide a quick and easy representation. Instead, the loss rate map as discussed herein allows for easier interpretation to the total charge loss per day (Ah/day) required to keep the test cell at the setpoint potential under different test conditions.

In some examples, multiple ESR change rates may be determined at different test conditions. Each test condition may be represented by a parameter set including one or more of a C-rate value, a temperature measurement, or a cell voltage setpoint, among other variables. Each parameter may take a plurality of values, such as a plurality of C-rates, a plurality of temperatures, or a plurality of setpoint voltage. The resulting ESR change rates may be expressed as a parameterized representation over one or more of said variables. Examples of the parameterized representation include a multidimensional array or a multidimensional graph, such as an ESR change rates map discussed below with reference to FIG. 10C.

Figure 10C:
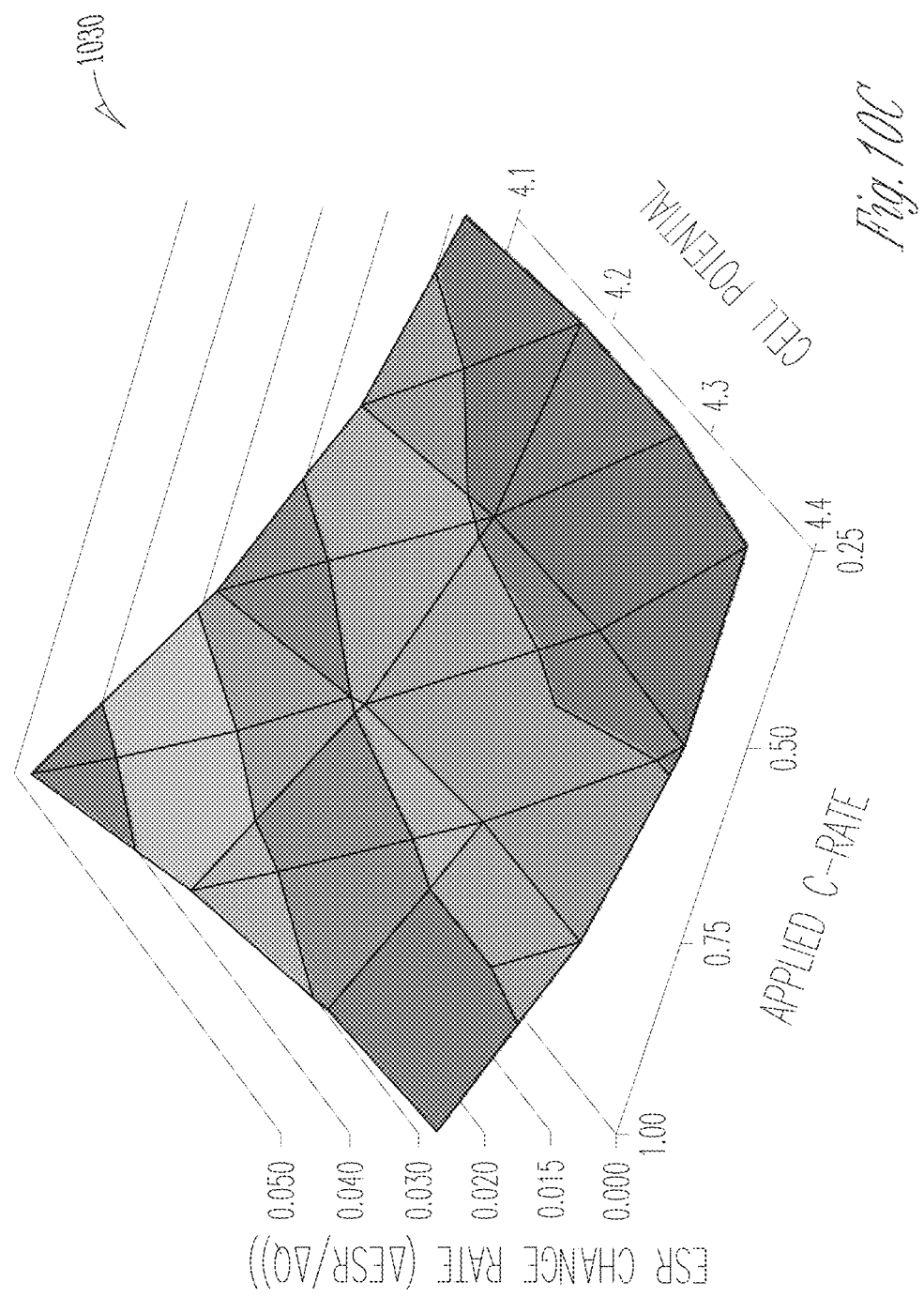

FIGS. 10A-10C illustrate, by way of example and not limitation, graphical representations of performance metric, such as a self-discharge rate or an ESR change rate, calculated under different test conditions. In particular, FIG. 10A is a graph illustrating, a loss rate curve 1010 under different applied C-rates obtained during cycle test of a battery. In this example, the cell voltage setpoint is 4.4V, and the cycle test was performed at controlled temperature of 45° C. The loss rate curve 1010 is represented by an amount of charge loss per day (Ah/day), and may be measured under different applied C-rates. FIG. 10A shows that a higher C-rate results in more charge loss (Ah/day) to keep the test cell at the setpoint potential.

FIG. 10B illustrates a loss rate map 1020 of self-discharge rate (in mA) under various test conditions represented by different C-rates and different cell voltage setpoints. The single battery cell is the same type as described above with reference to FIG. 8. By way of example and not limitation, the self-discharge rate may be measured at various combinations of (1) one of four different C-rates (0.25C, 0.5C, 0.75C, and 1C), and (2) one of four different cell potentials (4.1V, 4.2V, 4.3V, and 4.4V). The resulting loss rate map 1020 shows that the discharge rate of the battery is a major function of cell potential and a minor function of C-rate at the conditions studied. The discrete C-rates and the discrete cell potentials are by way of example and not limitation. For example, a loss rate map with finer resolution, a wider range of C-rates, or different average cell voltage setpoints may be generated. The loss rate map may be rendered as a 3D contour plot, surface plot, mesh plot, etc., or a 2D color map or grayscale map where the self-discharge rates may be represented by different colors or grayscales.

Similar to the multiple self-discharge rates that can be calculated under various test conditions as shown in the loss rate map 1020, multiple ESR change rates may be calculated under different test conditions. FIG. 10C illustrates an ESR change rate map 1030 showing ESR change rates (in ohm/coulomb) under various test conditions represented by different C-rates and different cell voltage setpoints. The single battery cell is the same type described above with reference to FIG. 8. In this non-limiting example, the ESR change rate can be calculated from the slope of ESR per total applied coulomb graph of FIG. 9 at various combinations of (1) one of four different C-rates (0.25C, 0.5C, 0.75C, and 1C), and (2) one of four different cell potentials (4.1V, 4.2V, 4.3V, and 4.4V). The resulting ESR change rate map 1030 shows that the change in ESR per lost coulomb is a major function of cell potential and C-rate at the conditions studied. The discrete C-rates and the discrete cell potentials are by way of example and not limitation. For example, an ESR change rate map with finer resolution, a wider range of C-rates, or different average cell voltage setpoints may be generated. The ESR change rate map may be rendered as a 3D contour plot, surface plot, mesh plot, etc., or a 2D color map or grayscale map where the self-discharge rates may be represented by different colors or grayscales.

The loss rate map 1020 or the ESR change rate map 1030 may be generated in such a way that each data point (e.g., a self-discharge rate corresponding to a particular C-rate and a particular cell potential, or an ESR change rate corresponding to a particular C-rate and a particular cell potential) is calculated from a different battery cell of similar construction to examine hysteresis effects. For example, as the loss rate map 1020 and the ESR change rate map 1030 each has 16 data points corresponding to 16 test conditions (C-rate and cell potential pairs), 16 batteries may be mapped to the 16 test conditions and tested concurrently under the respective test conditions. The resulting 16 data points are then obtained from different batteries. This may avoid or substantially reduce hysteresis. Hysteresis may occur during repeated testing of one battery under different test conditions. For example, if at high voltage the cell is damaged at one test condition, subsequent data points can be systematically off from that time on.

The loss rate map 1020 or the ESR change rate map 1030 may be generated for a cell at different time, such as after battery aging. In an example, an initial map (an initial loss rate map or an initial ESR change rate map) may be generated of a fresh cell. Then battery can then be stored in the oven for a specified period (e.g., 3-5 days), and new tests can be performed to generate a new loss rate map or a new ESR change rate map. A comparison of the newly generated map to the initial map may be used to characterize the changes in battery properties over time.

Figure 11:
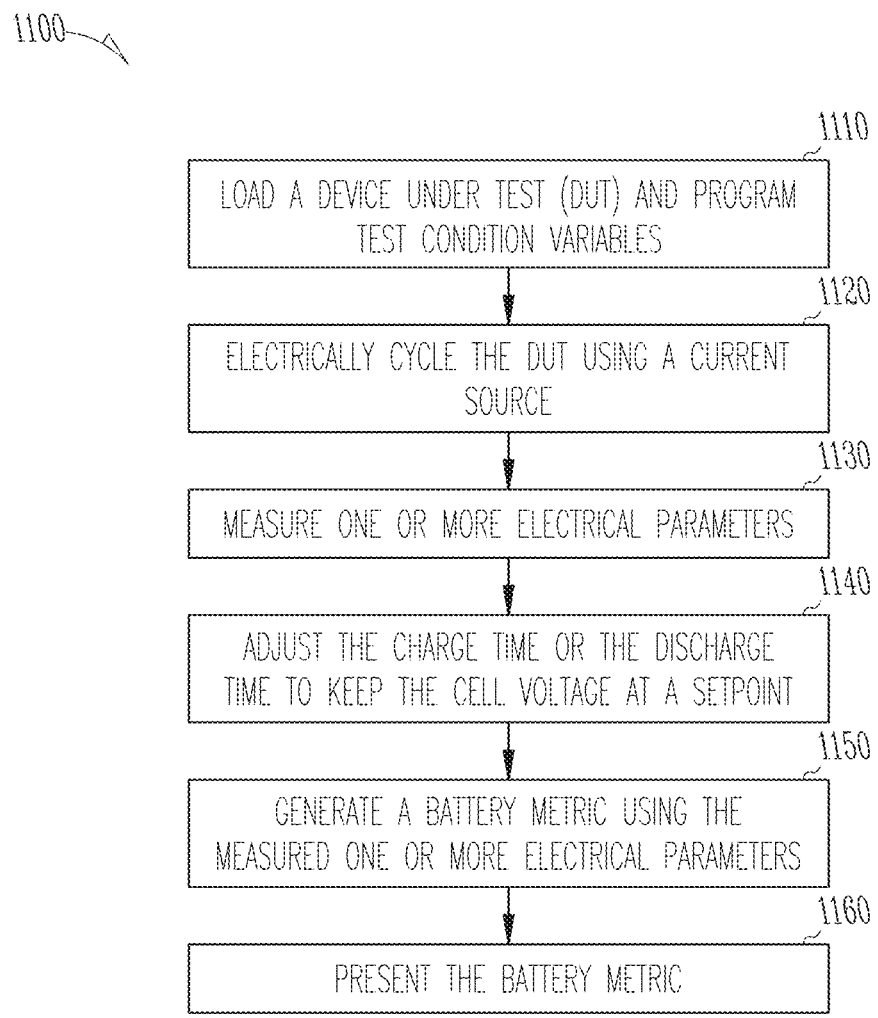
FIG. 11 is a flow chart illustrating an example of a method for performing diagnostic testing of a device under test (DUT) using cycle coulometry as described with reference to FIG. 1.

FIG. 11 is a flow chart illustrating an example of a method 1100 for performing diagnostic testing of a device under test (DUT) using cycle coulometry as discussed above with reference to FIG. 1. Examples of the DUT may include any electrochemical cells, such as batteries, fuel cells, flow cells, or other electrochemical cells. The method 1100 may be implemented in, and executed by, a battery testing system, such as the battery testing system 500. In an example, at least a portion of the method 1100 may be implemented in apparatus such as a cyclic coulometer as discussed above with reference to FIG. 1.

The method 1100 commences at 1110, where a DUT may be loaded in a testing environment, and test condition variable may be programmed to the testing system. The testing environment may be a precise temperature-controlled environment with temperature stabilized to <0.1° C. In an example, the DUT is loaded to a temperature-controlled oven. The DUT may be engaged with a testing system or device (e.g., the battery testing system 500 or the cyclic coulometer system 100), such as via the interface board 520 of the system 500. Example of DUT connection may include 2-wire, 3-wire, or 4-wire connections, among other state-of-art connection configurations. The testing system or device may be programmed with test condition variables, such as via a user interface of the monitor device 540. In example, the test condition variable includes a set cell potential, also known as voltage setpoint of the DUT. In another example, the test condition variable includes a C-rate. In yet another example, the test condition variable includes a set temperature of the testing environment. Other examples of the test condition variables may include a cycling period, a base charge time, and a base discharge time, among others.

At 1120, the electrical cycling process begins by applying a charge current during a charge step of a cycling period, following by applying a discharge current during a discharge step of the cycling period. The charge and discharge steps may sustain for a specified base charge time and a specified base discharge time. The base charge time and the base discharge time may be programmable. In an example, the base charge time and the base discharge time are 30 seconds each, giving a cycling period of 60 seconds. The 30-second charge step is sufficiently long to allow the voltage profile to fully develop in the electrochemical cell.

The charge current and the discharge current may be provided by a current source, such as the current source 110. In an example, the current source may be a single DC current source configured to provide unidirectional current. To provide symmetric charge current and discharge current of opposite directions, direction of current flow may be reversed at specific current switch timing from forward flow (charge current) to reverse flow (discharge current). Reversing the current direction may be achieved by using, for example, the switching circuit 120 or a variant thereof (e.g., the current switching circuit 200 or 300), as discussed above. Current symmetry has the benefit that offset errors present on the charging cycle cancels with the same offset present on the discharging cycle. Using the single current source also helps improve stability of current output during charge and discharge steps.

At 1130, one or more electrical parameters may be measured during the cycling process (e.g., during charging or discharging of the DUT). Examples of the electrical parameters may include voltage or current responses of the DUT, such as average or peak cell voltage over the cycling period, average or peak charge voltage, average or peak discharge voltage, end of cycle voltage, average or peak current over the cycling period, average or peak charge current, average or peak discharge current, among others. In an example, the one or more electrical parameters may be measured using the DAS 521, or a variant thereof (e.g., DAS 640 or 740). The measured parameter may be pre-processed and digitized.

At 1140, one or more of the charge time or the discharge time may be adjusted to keep a measured output variable, such as an average voltage of the DUT, at a preset cell voltage setpoint. Such an adjustment of the charge time or discharge time may be automatically controlled by, for example, the process controller 130 or the current switching controller 533. In an example, the adjustment of the charge time or the discharge time may include changing a current switch timing between the charge and discharge steps in a cycling period. In an example, the current switching may include an excess time $\Delta t$ added to or subtracted from charge time or discharge time. By way of example and as illustrated in FIGS. 4A-4E, the charge time or discharge time may be independently increased or decreased by the excess time $\Delta t$. The excess time $\Delta t$ may be represented by time duration (e.g., in msec or μsec), or alternatively by a count of excess timer ticks. A tick has a duration of a switching timer resolution T. In an example, T is approximately 200 nsec. Stable, ultrafine tuning of charge-discharge cycle (in ticks, or increments of T) may thus be achieved.

In various examples, the measured one or more electrical parameters at 1130 may include a voltage or current response of the DUT during the cycling period. The monitored voltage or current response may be used to determine or update the current switch timing (e.g., the excess charge time $\Delta t$ or the excess timer tick count) at 1140, so as to keep a specific electrical parameter (e.g., an average cell voltage) at the specific setpoint. In an example, the excess charge time $\Delta t$ or the excess timer tick count may be initialized to zero at the beginning of the test. System controllers, such as PI control, PID control, among other feedforward or feedback control, may be used to expedite the convergence of the measured output variable to a desired setpoint with little overshoot or oscillation. The current switch timing (e.g., excess charge time $\Delta t$ or the excess timer tick count) may be update continuously or periodically. In an example, the current switch timing (e.g., excess charge time $\Delta t$ or the excess timer tick count) may be updated on a frame-by-frame basis. In some examples, on or more input variables may additionally be used for controlling the adjustment of charge time or discharge time. In an example, a temperature of the electrochemical cell may be monitored. In another example, cell conditions such as state of charge or state of health of the DUT may be measured or estimated. One or more of these monitored variables may additionally be used to update the excess charge time Δt or the excess timer tick count, which may accelerate convergence of the electrochemical cell to the setpoint average potential. In an example, an initial current switch timing may be corrected using electrical measurements, or battery metrics and diagnostic information, to achieve faster control.

At 1150, a battery metric may be generated using the measured one or more electrical parameter, such as using the battery metric generator 534. The battery metric may be indicative of performance specifications of the DUT, or characterize the state of charge or the state of health of the DUT. In an example, the battery metric includes an amount of total charge applied during a specified portion of the cycling period. In an example, the battery metric may include a self-discharge rate (also known as loss rate) that may be determined based on a rate of change of the total charge applied over time. In some examples, the battery metric may include an equivalent series resistance (ESR) of the DUT. Other examples of the battery metric may include actual coulomb applied per step, the average voltage of the charge step, the average voltage of the discharge step, the average cell potential, or the proportional and integral terms of the system controller (that is, the "P" and "I" terms in a PI controller or a PID controller), among others. Examples of generating the battery metric are discussed below, such as with reference to FIGS. 12 and 13.

At 1160, the generated battery metric may be provided to a user or a process. In an example, the batter metric may be output to a system user, displayed on a monitor such as a personal computer (PC) or a mobile device. The battery metric and diagnostic information, optionally along with other measurements, may be presented in texts, tables, or graphs. By way of example, total charge applied and the self-discharge rate as illustrated in FIG. 8, the ESR curve as illustrated in FIG. 9, and a loss rate curve or a loss rate map representing parametrized self-discharge rate as shown in FIGS. 10A-10B may be displayed on the output device. The system user may take further actions (e.g., generate battery diagnostics or perform further testing) based on the battery metric.

FIGS. 12 and 13 are flow charts illustrating respective methods 1200 and 1300 of generating various battery metrics using the electrical measurements taken during a cycle test such as according to the method 1100. The method 1200 shown in FIG. 12 commences at 1210 to determine an amount of total charge applied per frame (QPF, in coulombs). The QPF may be determined using a coulomb counter, or calculated by integrating an applied current over time within the entirety of a frame, such as given by Equation (1). In an example, the QPF may be determined from the difference in the total charge applied during charge and the total charge applied during discharge, such as given by Equation (2). In an example, the battery metric may include an amount of total charge applied during charge, or an amount of total charge applied during discharge, which may be determined respectively according to Equations (3) and (4). In an example, the QPF may be calculated by using the difference in the excess tick count between the charge and discharge periods, as given in Equation (5), or by using an integral value (INT) of the PI or PID algorithm used to generate the frame timing, as given in Equation (6). At 1220, the QPF may be trended over time to generate a total coulomb curve plotted versus time, an example of which is shown in FIG. 8. At 1230, an applied coulomb rate (also known as a self-discharge rate), may be determined, such as using a slope of the total coulomb curve at a particular time (dQ/dt) The applied coulomb rate represents an effective applied current needed to maintain the system in control (e.g., an output average cell voltage being kept at a control level).

The self-discharge rate represents an applied current needed to keep the cell voltage of the electrochemical cell at the specific setpoint. In some examples, the total charge applied and the self-discharge rate may be determined under individually addressable and specified test conditions. Each test condition may be represented by a parameter set including, for example, one or more of a C-rate value, a temperature measurement, or a cell voltage setpoint, among other variables. Each parameter may take a plurality of values. The resulting loss rates may be expressed as a parameterized representation over one or more of said variables. In an example, the parameterized representation includes a multidimensional array. In another example, the parameterized representation includes a multidimensional graph, such as a loss rate curve or a loss rate map or surface.

The method 1300 shown in FIG. 13 commences at 1310 to determine an amount of total charge applied per frame (QPF). At 1320, an equivalent series resistance (ESR) of the DUT during charge and discharge per frame may be determined. The ESR may be calculated using a change in cell voltage ($\Delta V$)(such as obtained from the difference of the average charge voltage 820 and the average cell voltage response 810 or the average discharge voltage 830 and the average cell voltage 810) and the applied current, such as according to Equations (7) and (8). In an example, the average cell voltage used for calculating the ESR may be represented by an average voltage of an entirety of the cycling period. The average cell voltage may be determined using a simple average of the average charge and average discharge voltages. Alternatively, the average cell voltage may be determined using a weighted average of the cell voltage during charge and the cell voltage during discharge, such as according to Equation (9). In another example, an average or terminal voltage of only the charge cycle or the discharge cycle may be used to determine the cell voltage used for calculating the ESR. In another example, the cell voltage used for calculating the ESR may be obtained by calculating an average charge and average discharge voltage symmetric around the current switch with respect to time, such as given by Equation (10).

At 1330, an ESR curve may be generated. The ESR curve is plotted versus total charge applied, an example of which is shown in FIG. 9. At 1340, an ESR change rate per lost coulomb may be determined, which represents a rate of ESR change over a change in total charge applied (dESR/dQ). The ESR change rate per lost coulomb indicates how damaging each lost coulomb is to cell resistance. The coulometry technique discussed herein advantageously quantifies how damaging each lost coulomb is to cell resistance in a continuous manner.

In various examples, the method of 1200 and the method of 1300 can be complementary. Information of the ESR change rate per lost coulomb at 1340 is a measure of how damaging each lost coulomb is to cell performance. Information on the applied coulomb rate (self-discharge rate) at 1230 is a measure of the generation rate of lost coulombs. Together, the battery metrics produced by the methods of 1200 and 1300 present new battery metrics to understand cell degradation at individual addressable load conditions such as temperature, C-rate, and cell potential.

Figure 14:
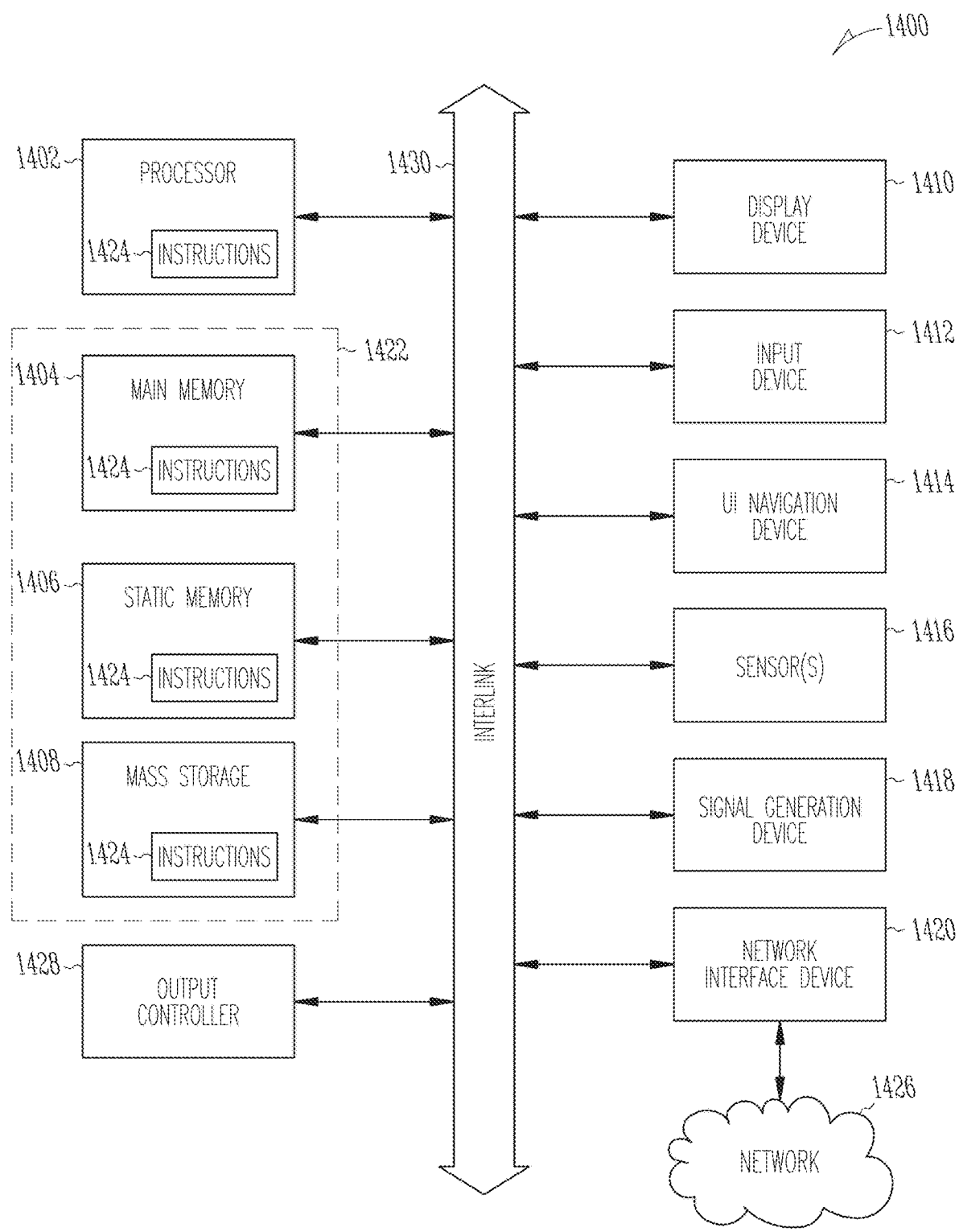
FIG. 14 illustrates generally a block diagram of an example machine upon which any one or more of the techniques (e.g., methodologies) discussed herein may be performed.

FIG. 14 illustrates generally a block diagram of an example machine 1400 upon which any one or more of the techniques (e.g., methodologies) discussed herein may be performed. Portions of this description may apply to the computing framework of various portions of the cyclic coulometer system 100 or the battery testing system 500.

In alternative embodiments, the machine 1400 may operate as a standalone device or may be connected (e.g., networked) to other machines. In a networked deployment, the machine 1400 may operate in the capacity of a server machine, a client machine, or both in server-client network environments. In an example, the machine 1400 may act as a peer machine in peer-to-peer (P2P) (or other distributed) network environment. The machine 1400 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Machine (e.g., computer system) 1400 may include a hardware processor 1402 (e.g., a central processing unit (CPU), a graphics processing unit (GPU), a hardware processor core, or any combination thereof), a storage device such as a machine readable medium 1422 that may include one or more of a main memory 1404, a static memory 1406, or a mass storage 1408, some or all of which may communicate with each other via an interlink (e.g., bus) 1430. The machine 1400 may further include a display unit 1410 (e.g., a raster display, vector display, holographic display, etc.), an alphanumeric input device 1412 (e.g., a keyboard), and a user interface (UI) navigation device 1414 (e.g., a mouse). In an example, the display unit 1410, input device 1412 and UI navigation device 1414 may be a touch screen display. The machine 1400 may additionally include one or more sensors 1416 (such as a global positioning system (GPS) sensor, compass, accelerometer, or other sensor), a signal generation device 1418 (e.g., a speaker), and a network interface device 1420. The machine 1400 may include an output controller 1428, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device such as the machine readable medium 1422 stores one or more sets of data structures or instructions 1424 (e.g., software) embodying or utilized by any one or more of the techniques or functions described herein. The instructions 1424 may be reside, completely or at least partially, within the main memory 1404, within the static memory 1406, within the mass storage 1408, or within the hardware processor 1402 during execution thereof by the machine 1400. In an example, one or any combination of the hardware processor 1402, the main memory 1404, the static memory 1406, or the mass storage 1408 may constitute machine-readable media.

While the machine-readable medium 1422 is illustrated as a single medium, the term "machine readable medium" may include a single medium or multiple media (e.g., a centralized or distributed database, and/or associated caches and servers) configured to store the one or more instructions 1424.

The term "machine readable medium" may include any medium that is capable of storing, encoding, or carrying instructions for execution by the machine 1400 and that cause the machine 1400 to perform any one or more of the techniques of the present disclosure, or that is capable of storing, encoding or carrying data structures used by or associated with such instructions. Non-limiting machine-readable medium examples may include solid-state memories, and optical and magnetic media. In an example, a massed machine-readable medium comprises a machine readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1424 may further be transmitted or received over a communications network 1426 using a transmission medium via the network interface device 1420 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as WiFi®, IEEE 802.16 family of standards known as WiMax®), IEEE 802.15.4 family of standards, peer-to-peer (P2P) networks, among others. In an example, the network interface device 1420 may include one or more physical jacks (e.g., Ethernet, coaxial, or phone jacks) or one or more antennas to connect to the communications network 1426. In an example, the network interface device 1420 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1400, and includes digital or analog communications signals or other intangible medium to facilitate communication of such software.

Various embodiments are illustrated in the figures above. One or more features from one or more of these embodiments may be combined to form other embodiments.

The method examples described herein can be machine or computer-implemented at least in part. Some examples may include a computer-readable medium or machine-readable medium encoded with instructions operable to configure an electronic device or system to perform methods as described in the above examples. An implementation of such methods may include code, such as microcode, assembly language code, a higher-level language code, or the like. Such code may include computer readable instructions for performing various methods. The code can form portions of computer program products. Further, the code can be tangibly stored on one or more volatile or non-volatile computer-readable media during execution or at other times.

The above detailed description is intended to be illustrative, and not restrictive. The scope of the disclosure should, therefore, be determined with references to the appended claims, along with the full scope of equivalents to which such claims are entitled.

What is claimed is:

1. A method for testing an electrochemical cell, comprising:
    electrically cycling the electrochemical cell by applying a charge current for a charge time and a discharge current for a discharge time in a cycling period, the charge current and the discharge current being symmetric and having opposite directions;
    measuring one or more electrical parameters of the electrochemical cell during the cycling period of the electrochemical cell;
    adjusting the charge time or the discharge time for controlling a monitored cell voltage of the electrochemical cell toward a specific setpoint; and
    generating a performance metric of the electrochemical cell using the measured one or more electrical parameters, the performance metric indicative of an amount of coulombs applied into or out of the electrochemical cell during the cycling period.

2. The method of claim 1, wherein adjusting the charge time or the discharge time includes updating a current switch timing for reversing from the charge current to the discharge current.

3. The method of claim 2, wherein the measured one or more electrical parameters include a voltage or current response of the electrochemical cell, and wherein updating the current switch timing is by using the monitored voltage or current response.

4. The method of claim 2, wherein adjusting the charge time or discharge time includes increasing or decreasing the charge time by an excess charge time, the excess charge time represented by a count of ticks each having a duration of specified switching timer resolution.

5. The method of claim 2, wherein adjusting the charge time or discharge time includes increasing or decreasing the discharge time by an excess discharge time, the excess discharge time represented by a count of ticks each having a duration of a specified switching timer resolution.

6. The method of claim 1, wherein generating the performance metric includes:
    determining an amount of total charge applied during a specified portion of the cycling period; and
    determining a self-discharge rate using the determined amount of total charge applied, the self-discharge rate representing an applied current needed to keep the cell voltage of the electrochemical cell at the specific setpoint.

7. The method of claim 6, wherein the amount of total charge applied includes a total charge applied per frame (QPF) corresponding to time of the frame, and wherein determining the self-discharge rate includes using a slope of a trend of QPF over time.

8. The method of claim 7, wherein determining the QPF includes integrating the applied current over time within a frame.

9. The method of claim 7, wherein determining the QPF includes:
    determining a first amount of total charge applied during only a charge period, and a second amount of total charge applied during only a discharge period subsequent to the charge period; and
    determining the QPF using a difference between the first amount of total charge applied and the second amount of total charge applied.

10. The method of claim 9, wherein the first amount of total charge applied is determined by using a first total tick count during only the charge period, and the second amount of total charge applied is determined by using a second total tick count during only the discharge period.

11. The method of claim 6, wherein the measured one or more electrical parameters include a cell voltage of the electrochemical cell, and wherein generating the performance metric includes determining an equivalent series resistance (ESR) of the electrochemical cell using (1) at least one of a charge voltage during a charge period or a discharge voltage during a discharge period, and (2) the applied current.

12. The method of claim 11, wherein generating the performance metric includes:
    generating an ESR curve as a function of the amount of total charge applied; and
    determining an ESR change rate per lost coulomb using a slope of the ESR curve at a specific amount of total charge applied.

13. The method of claim 12, comprising:
    determining multiple ESR change rates under different test conditions, each of the different test conditions represented by a parameter set including one or more of a C-rate value, a temperature measurement, or a cell voltage setpoint; and
    generating a representation of the multiple ESR change rates over the parameter set, the representation including a two- or multi-dimensional array, or a two- or multi-dimensional graph.

14. The method of claim 6, wherein generating the performance metric includes:

determining multiple self-discharge rates under different test conditions each represented by a parameter set including one or more of a C-rate value, a temperature measurement, or a cell voltage setpoint; and generating a representation of the multiple self-discharge rates over the parameter set, the representation including a two- or multi-dimensional array, or a two- or multi-dimensional graph.

15. The method of claim 14, comprising displaying on a user interface one or more of the measured one or more electrical parameters or the measured performance metric.

16. At least one machine-readable medium including instructions that, when executed by a machine, cause the machine to:

electrically cycle an electrochemical cell by applying a charge current for a charge time and a discharge current for a discharge time in a cycling period, the charge current and the discharge current being symmetric and having opposite directions;

measure one or more electrical parameters of the electrochemical cell during the cycling period of the electrochemical cell;

adjust the charge time or the discharge time for controlling a monitored cell voltage of the electrochemical cell toward a specific setpoint; and generate a performance metric of the electrochemical cell using the measured one or more electrical parameters, the performance metric indicative of an amount of coulombs applied into or out of the electrochemical cell during the cycling period.

17. The at least one machine-readable medium of claim 16, wherein the instructions, when performed by the machine, cause the machine to:

measure one or more electrical parameters including a voltage or current response of the electrochemical cell; and update a current switch timing for reversing from the charge current to the discharge current using the monitored voltage or current response.

18. The at least one machine-readable medium of claim 16, wherein the instructions, when performed by the machine, cause the machine to:

determine an amount of total charge applied during a specified portion of the cycling period; and determine a self-discharge rate using the determined amount of total charge applied, the self-discharge rate representing an applied current needed to keep the cell voltage of the electrochemical cell at the specific setpoint.

19. The at least one machine-readable medium of claim 18, wherein the amount of total charge applied includes a total charge applied per frame (QPF) corresponding to time of the frame, and wherein the instructions, when performed by the machine, cause the machine to:

generate a trend of QPF over time; and determine the self-discharge rate using a slope of the generated trend of QPF.

20. The at least one machine-readable medium of claim 18, wherein the measured one or more electrical parameters include a cell voltage of the electrochemical cell, and wherein the instructions, when performed by the machine, cause the machine to:

determine an equivalent series resistance (ESR) of the electrochemical cell using (1) at least one of a charge voltage during a charge period or a discharge voltage during a discharge period, and (2) the applied current;

generate an ESR curve as a function of the amount of total charge applied; and determine an ESR change rate per lost coulomb using a slope of the ESR curve at a specific amount of total charge applied.

21. The at least one machine-readable medium of claim 20, wherein the instructions, when performed by the machine, cause the machine to:

determine multiple ESR change rates under different test conditions, each of the different test conditions represented by a parameter set including one or more of a C-rate value, a temperature measurement, or a cell voltage setpoint; and generate a representation of the multiple ESR change rates over the parameter set, the representation including a two- or multi-dimensional array, or a two- or multi-dimensional graph.

22. The at least one machine-readable medium of claim 18, wherein the instructions, when performed by the machine, cause the machine to:

determine multiple self-discharge rates under different test conditions each represented by a parameter set including one or more of a C-rate value, a temperature measurement, or a cell voltage setpoint; and generate a representation of the multiple self-discharge rates over the parameter set, the representation including a two- or multi-dimensional array, or a two- or multi-dimensional graph.

* * * * *